US012696590B2

(12) United States Patent
Bai et al.

(10) Patent No.: US 12,696,590 B2
(45) Date of Patent: Jul. 28, 2026

(54) DISPLAY PANEL, DISPLAY DEVICE, AND MANUFACTURING METHOD OF DISPLAY PANEL

(71) Applicants: BOE MLED Technology Co., Ltd., Beijing (CN); BOE TECHNOLOGY GROUP CO., LTD., Beijing (CN)

(72) Inventors: Yuxuan Bai, Beijing (CN); Pengju Hu, Beijing (CN); Pengwei Wang, Beijing (CN); Lei Wu, Beijing (CN); Shiwei Han, Beijing (CN); Huan Wang, Beijing (CN); Pengwei Zhang, Beijing (CN); Qi Qi, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 544 days.

(21) Appl. No.: 18/250,931

(22) PCT Filed: Mar. 28, 2022

(86) PCT No.: PCT/CN2022/083506
§ 371 (c)(1),
(2) Date: Apr. 27, 2023

(87) PCT Pub. No.: WO2023/184120
PCT Pub. Date: Oct. 5, 2023

(65) Prior Publication Data
US 2024/0332458 A1    Oct. 3, 2024

(51) Int. Cl.
*H10H 20/831* (2025.01)
*H10D 86/40* (2025.01)
(Continued)

(52) U.S. Cl.
CPC ...... *H10H 20/8312* (2025.01); *H10D 86/443* (2025.01); *H10D 86/60* (2025.01); *H10H 20/857* (2025.01); *H10W 90/00* (2026.01)

(58) Field of Classification Search
CPC ............ H10H 20/8312; H10H 20/857; H10D 86/443; H10D 86/60; H10W 90/00; G09F 9/302; G09F 9/33; H10P 95/00
See application file for complete search history.

(56) References Cited

U.S. PATENT DOCUMENTS

2009/0156104 A1    6/2009  Kim et al.
2012/0320329 A1*  12/2012  Lee .................... G02F 1/16755
                                              349/158
(Continued)

FOREIGN PATENT DOCUMENTS

CN        103533107 A      1/2014
CN        106373981 A      2/2017
(Continued)

OTHER PUBLICATIONS

PCT International Search Report (w/ English Translation) and Written Opinion for corresponding PCT Application No. PCT/CN2022/083506, dated Dec. 21, 2022, 12 pages.
(Continued)

*Primary Examiner* — Su C Kim
(74) *Attorney, Agent, or Firm* — Dority & Manning, P.A.

(57) ABSTRACT

A display panel, a display device and a manufacturing method of a display panel are provided. The display panel includes a backplane and a plurality of first electrodes. The backplane includes a first main surface and a second main surface opposite to each other, and a plurality of side surfaces connecting the first main surface and the second main surface. At least one side surface in the plurality of side surfaces is a selected side surface. Two adjacent side surfaces are provided with a transition side surface therebe-
(Continued)

10~100 tween, and are connected through the transition side surface. The plurality of first electrodes are disposed on the first main surface. The plurality of first electrodes are adjacent to the selected side surface.

18 Claims, 14 Drawing Sheets

(51) Int. Cl.
| | |
|---|---|
| *H10D 86/60* | (2025.01) |
| *H10H 20/857* | (2025.01) |
| *H10W 90/00* | (2026.01) |

(56) References Cited

U.S. PATENT DOCUMENTS

| | | | |
|---|---|---|---|
| 2019/0123249 | A1 | 4/2019 | Hirano et al. |
| 2019/0333979 | A1 | 10/2019 | Aoki et al. |
| 2020/0259056 | A1* | 8/2020 | Hong ................... H01L 25/167 |
| 2021/0300099 | A1 | 9/2021 | Caselli et al. |

| | | | |
|---|---|---|---|
| 2021/0399185 | A1 | 12/2021 | Liu et al. |
| 2022/0302362 | A1 | 9/2022 | Gong et al. |
| 2023/0148186 | A1 | 5/2023 | Hsu et al. |

FOREIGN PATENT DOCUMENTS

| | | | |
|---|---|---|---|
| CN | 106887468 | A | 6/2017 |
| CN | 110503898 | A | 11/2019 |
| CN | 212256800 | U | 12/2020 |
| CN | 112614958 | A | 4/2021 |
| CN | 113241368 | A | 8/2021 |
| CN | 113270457 | A | 8/2021 |
| CN | 113946077 | A | 1/2022 |
| CN | 114783302 | A | 7/2022 |
| JP | 2000180808 | A | 6/2000 |
| JP | 2001144274 | A | 5/2001 |
| JP | 2009231833 | A | 10/2009 |

OTHER PUBLICATIONS

PCT International Search Report and Written Opinion (w/ English translations) for corresponding PCT Application No. PCT/CN2023/084536, dated Jun. 20, 2023, 21 pages.

\* cited by examiner

10
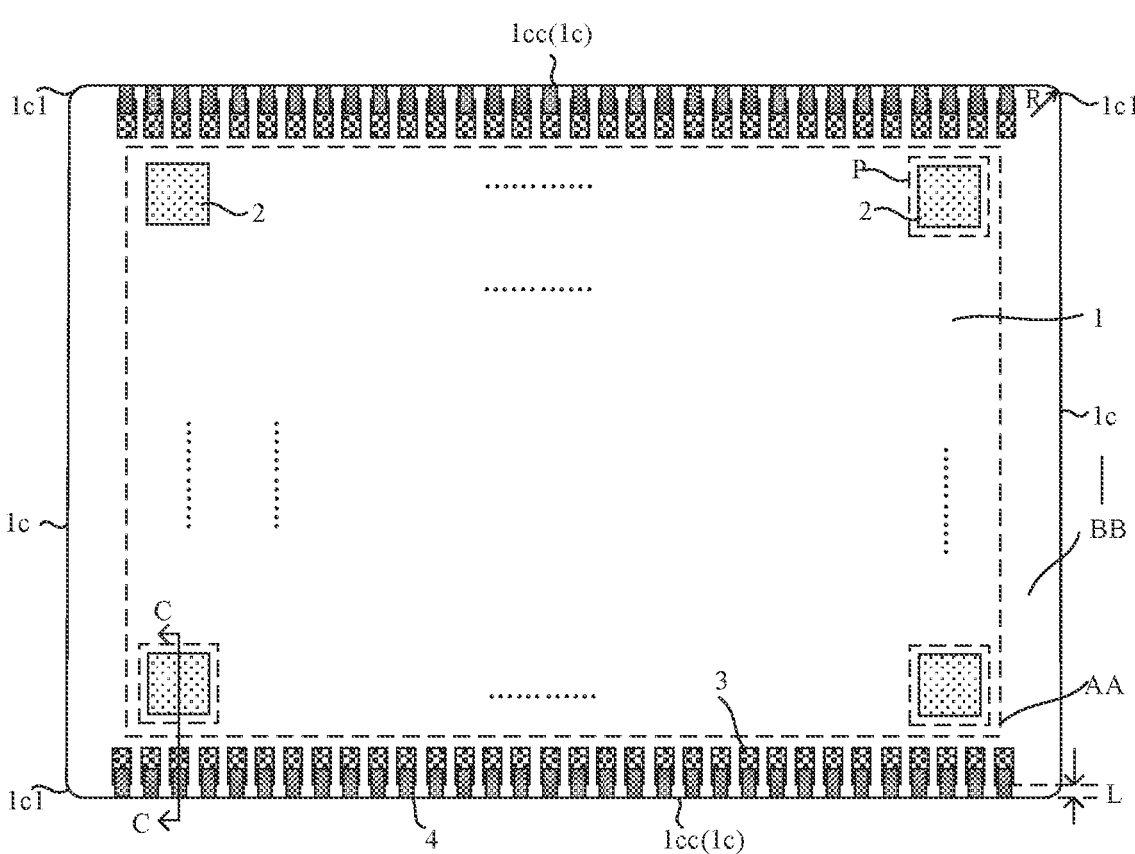
FIG. 1
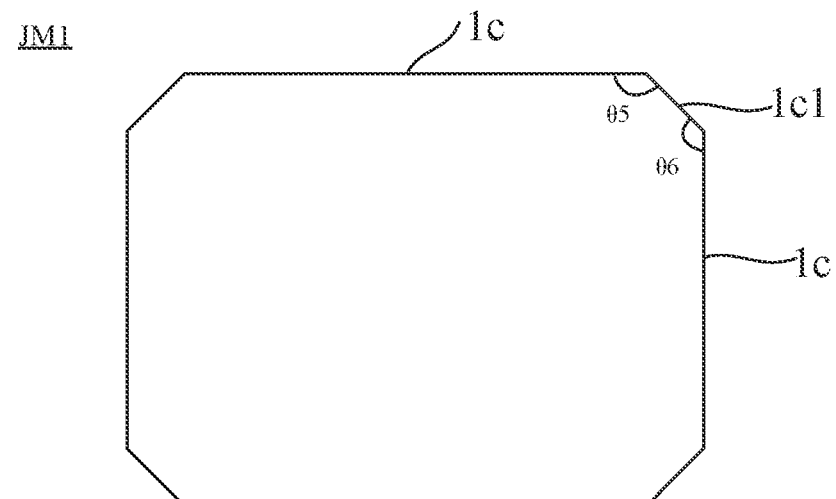
FIG. 2A

JM2

1c

1c1

1c

1c

1c11

1c12

θ7

θ9

1c11

θ8

1c

100

Provide an initial backplane; the initial backplane including a first main surface and a second main surface opposite to each other, and a plurality of side surfaces connecting the first main surface and the second main surface; the plurality of side surfaces being perpendicular to or substantially perpendicular to the first main surface and the second main surface  ⟿S1

Form a plurality of first electrodes on the first main surface of the initial backplane; the plurality of first electrodes being adjacent to at least one side surface in the plurality of side surfaces, and the at least one side surface being a selected side surface  ⟿S2

Grind boundary edge(s) each being a boundary edge of two adjacent side surfaces to form transition side surface(s) at the respective boundary edge(s); grind boundary edge(s) each being a boundary edge of the first main surface and a side surface to form first transition sub-surface(s) at the respective boundary edge(s), and grind boundary edge(s) each being a boundary edge of the second main surface and a side surface to form second transition sub-surface(s) at the respective boundary edge(s), so as to obtain the backplane  ⟿S3

Form a plurality of connection leads on the second main surface and the at least one side surface of the backplane; each of the plurality of connection leads being electrically connected to one of the plurality of first electrodes from the second main surface of the backplane via the selected side surface  ⟿S4

Form a protective adhesive layer on a side of the plurality of connection leads facing away from the backplane; the protective adhesive layer covering the plurality of connection leads  ⟿S5

FIG. 13

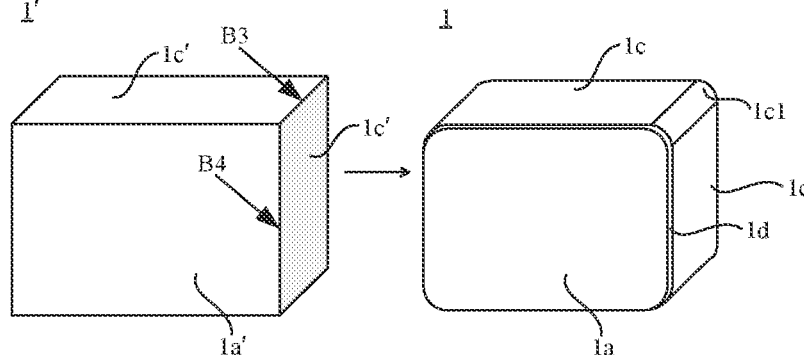

FIG. 14A

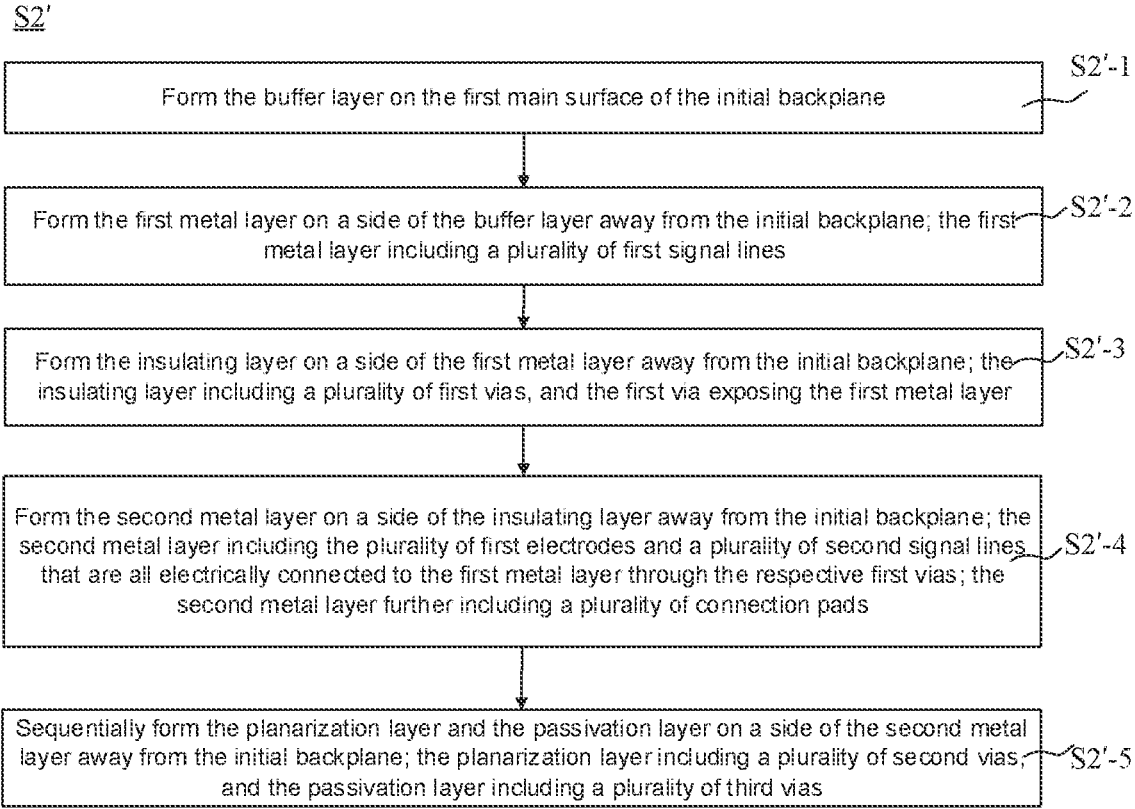

S2'

| S2'-1 Form the buffer layer on the first main surface of the initial backplane |

| S2'-2 Form the first metal layer on a side of the buffer layer away from the initial backplane; the first metal layer including a plurality of first signal lines |

| S2'-3 Form the insulating layer on a side of the first metal layer away from the initial backplane; the insulating layer including a plurality of first vias, and the first via exposing the first metal layer |

| S2'-4 Form the second metal layer on a side of the insulating layer away from the initial backplane; the second metal layer including the plurality of first electrodes and a plurality of second signal lines that are all electrically connected to the first metal layer through the respective first vias; the second metal layer further including a plurality of connection pads |

| S2'-5 Sequentially form the planarization layer and the passivation layer on a side of the second metal layer away from the initial backplane; the planarization layer including a plurality of second vias, and the passivation layer including a plurality of third vias |

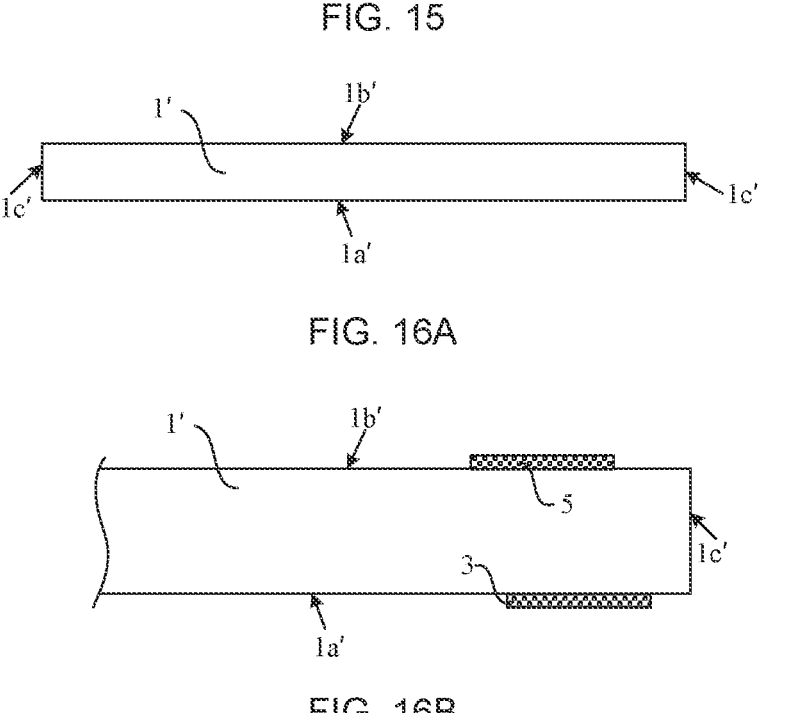

FIG. 16B

DISPLAY PANEL, DISPLAY DEVICE, AND MANUFACTURING METHOD OF DISPLAY PANEL

CROSS-REFERENCE TO RELATED APPLICATION

This application is a national phase entry under 35 USC 371 of International Patent Application No. PCT/CN 2022/083506 filed on Mar. 28, 2022, which is incorporated herein by reference in its entirety.

TECHNICAL FIELD

The present disclosure relates to the field of display technologies, and in particular, to a display panel, a display device, and a manufacturing method of a display panel.

BACKGROUND

As a new generation of display technology, MLED includes Mini LED (mini organic light-emitting diode) and Micro LED (micro organic light-emitting diode). Compared with a traditional LED, each Mini LED or Micro LED particle has a smaller volume, so that a display device in which Mini LEDs or Micro LEDs are used as light-emitting devices has characteristics of high contrast, long service life and low power consumption, and related technologies thereof become one of current research hotspots.

SUMMARY

In an aspect, a display panel is provided. The display panel includes a backplane and a plurality of first electrodes disposed on a first main surface. The backplane includes the first main surface and a second main surface opposite to each other, and a plurality of side surfaces connecting the first main surface and the second main surface. At least one side surface in the plurality of side surfaces is a selected side surface. Two adjacent side surfaces are provided with a transition side surface therebetween, and are connected through the transition side surface. The plurality of first electrodes are adjacent to the selected side surface.

In some embodiments, the transition side surface is an arc surface.

In some embodiments, an orthographic projection of the transition side surface on a plane where the first main surface is located is a circular arc, and a radius of the circular arc is in a range of 65 µm to 75 µm, inclusive.

In some embodiments, the transition side surface is a plane; or the transition side surface includes at least two adjacent planes.

In some embodiments, the transition side surface is the plane. In a section of the backplane taken along a plane parallel to the first main surface, an angle formed between the transition side surface and a side surface adjacent to the transition side surface is greater than 90°. Alternatively, the transition side surface includes the at least two adjacent planes, and a plane in the at least two adjacent planes connected to the side surface is a first plane. In a section of the backplane taken along the plane parallel to the first main surface, an angle formed between the first plane and the side surface connected to the first plane is greater than 90°, and an angle formed between two adjacent planes in the transition side surface is greater than 90°.

In some embodiments, the first main surface and a side surface in the plurality of side surfaces are provided with a first transition sub-surface therebetween, and are connected through the first transition sub-surface; and/or the second main surface and the side surface are provided with a second transition sub-surface therebetween, and are connected through the second transition sub-surface.

In some embodiments, in a section of the backplane taken along a plane perpendicular to the first main surface and the side surface, an angle formed between a tangent line at any point on the first transition sub-surface and the first main surface is greater than 90°, and an angle formed between the tangent line at the any point on the first transition sub-surface and the side surface is greater than 90°; and/or in a section of the backplane taken along a plane perpendicular to the second main surface and the side surface, an angle formed between a tangent line at any point on the second transition sub-surface and the second main surface is greater than 90°, and an angle formed between the tangent line at the any point on the second transition sub-surface and the side surface is greater than 90°.

In some embodiments, the first transition sub-surface and the second transition sub-surface each are a plane or an arc surface.

In some embodiments, the plurality of first electrodes are arranged side by side. A vertical distance between an end of each of the plurality of first electrodes proximate to the selected side surface and a plane where the selected side surface is located is in a range of 60 µm to 80 µm, inclusive.

In some embodiments, the display panel further includes: a plurality of light-emitting devices disposed on the first main surface of the backplane, the plurality of light-emitting devices being electrically connected to the plurality of first electrodes; and a plurality of connection leads disposed on the second main surface and the selected side surface of the backplane, each connection lead being electrically connected to one of the plurality of first electrodes from the second main surface via the selected side surface.

In some embodiments, the display panel further includes a plurality of second electrodes disposed on the second main surface of the backplane. The plurality of second electrodes are configured to be electrically connected to a driving chip or a flexible printed circuit. The connection lead is further electrically connected to one of the plurality of second electrodes.

In some embodiments, the display panel further includes a buffer layer, a first metal layer, an insulating layer, a second metal layer, a planarization layer and a passivation layer. The buffer layer is disposed on the first main surface of the backplane. The first metal layer is disposed on a side of the buffer layer away from the backplane. The first metal layer includes a plurality of first signal lines. The insulating layer is disposed on a side of the first metal layer away from the backplane. The second metal layer is disposed on a side of the insulating layer away from the backplane. The second metal layer includes the plurality of first electrodes and a plurality of second signal lines. The planarization layer is disposed on a side of the second metal layer away from the backplane. The passivation layer is disposed on a side of the planarization layer away from the backplane. A border of the passivation layer is closer to a side surface of the backplane than a border of the planarization layer located on a same side as the border of the passivation layer.

In some embodiments, the planarization layer covers a portion of the plurality of first electrodes. The border of the passivation layer is closer to the selected side surface of the backplane than a border of the plurality of first electrodes located on the same side as the border of the passivation layer.

In some embodiments, the plurality of first signal lines extend in a first direction, and each first signal line is electrically connected to a first electrode through a via penetrating the insulating layer. A dimension of the first electrode in a second direction is positively correlated with an average width of the first signal line connected to the first electrode in the second direction. The second direction is perpendicular to the first direction.

In some embodiments, the display panel includes a plurality of pixels arranged in an array, and each pixel includes at least two light-emitting devices and a pixel driving chip.

In some embodiments, the second metal layer further includes a plurality of connection pads connecting the light-emitting devices to the pixel driving chip.

In another aspect, a display device is provided. The display device includes the display panel in the above aspect and a driving chip. The driving chip is disposed on the second main surface of the backplane in the display panel. The driving chip is electrically connected to the plurality of first electrodes in the display panel through the plurality of connection leads in the display panel.

In yet another aspect, a manufacturing method of a display panel is provided. The manufacturing method includes following steps. An initial backplane is provided. The initial backplane includes a first main surface and a second main surface opposite to each other, and a plurality of side surfaces connecting the first main surface and the second main surface. The plurality of side surfaces are perpendicular to the first main surface and the second main surface.

A boundary edge of two adjacent side surfaces is ground to form a transition side surface at the boundary edge. The two adjacent side surfaces are connected through the transition side surface. The transition side surface is a plane; or the transition side surface includes at least two adjacent planes; or the transition side surface is an arc surface.

In some embodiments, in a process of grinding the boundary edge of the two adjacent side surfaces, a boundary edge of the first main surface and a side surface in the plurality of side surfaces is ground to form a first transition sub-surface; and/or a boundary edge of the second main surface and the side surface is ground to form a second transition sub-surface. The first transition sub-surface and the second transition sub-surface each are a plane or an arc surface.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings without creative effort.

FIG. 1 is a front view of a display panel, in accordance with some embodiments of the present disclosure;

FIG. 2A is a sectional view of a backplane of a display panel, in accordance with some embodiments of the present disclosure;

FIG. 13 is a flow diagram of a manufacturing method of a display panel, in accordance with some embodiments of the present disclosure;

FIG. 14A is a diagram showing three-dimensional structures of an initial backplane before and after grinding, in accordance with some embodiments of the present disclosure;

FIG. 15 is a flow diagram of another manufacturing method of a display panel, in accordance with some embodiments of the present disclosure;

FIGS. 16A to 16F are diagrams showing steps of a manufacturing method of a display panel, in accordance with some embodiments of the present disclosure;

DETAILED DESCRIPTION

Figures 2B, 2C:
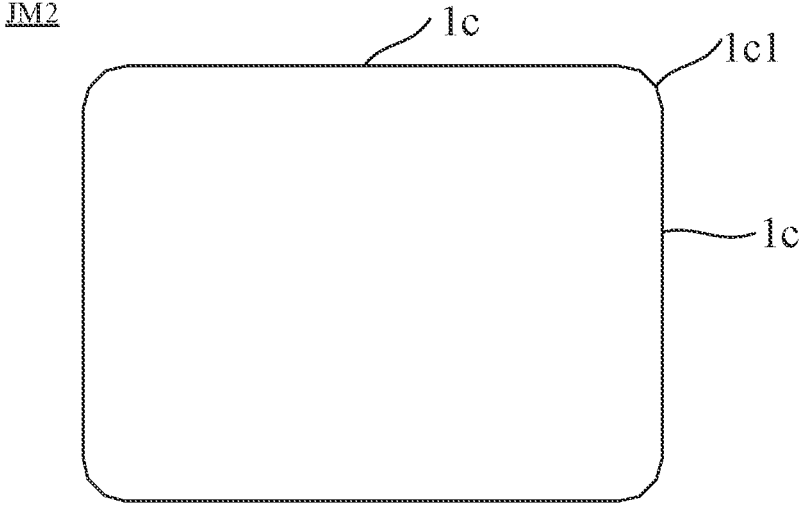
FIG. 2B is a sectional view of another backplane of a display panel, in accordance with some embodiments of the present disclosure.
FIG. 2C is a partial enlarged view according to the sectional view of the backplane shown in FIG. 2B.

In order to make the above objects, features and advantages of the present disclosure more comprehensible, technical solutions in the embodiments of the present disclosure will be described clearly and completely below with reference to the accompanying drawings in the embodiments of the present disclosure. Obviously, the described embodiments are merely some but not all embodiments of the present disclosure. All other embodiments obtained by a person of ordinary skill in the art without creative effort based on the embodiments of the present disclosure shall be included in the protection scope of the present disclosure.

Unless the context requires otherwise, throughout the description and the claims, the term "comprise" is construed as an open and inclusive meaning, i.e., "including, but not limited to." In the description of the specification, the terms such as "one embodiment." "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of or the plurality of" means two or more unless otherwise specified.

The use of the phrase "applicable to" or "configured to" herein means an open and inclusive expression, which does not exclude devices that are applicable to or configured to perform additional tasks or steps.

It will be understood that when a layer or element is described as being on another layer or substrate, the layer or element may be directly on the another layer or substrate, or intermediate layer(s) may exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances, may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

At present, in a display panel, transparent glass or organic glass is usually used as a base material of a backplane, and edges of the display panel are conventionally ground at right angle(s). In this way, during product transportation, problems of collision and edge and corner collapsing are easy to occur, so that a product quality and an overall qualified rate are seriously influenced, and a mass of consumables are generated, thereby increasing a production cost.

Based on this, some embodiments of the present disclosure provide a display panel, a display device, and a manufacturing method of a display panel. By changing the conventional right-angle grinding, smooth transition side surface(s) are obtained at edges of the display panel, thereby reducing a collapsing rate of edges of a product.

The display panel, the display device, and the manufacturing method of the display panel in the present disclosure will be described below.

Figure 4A:
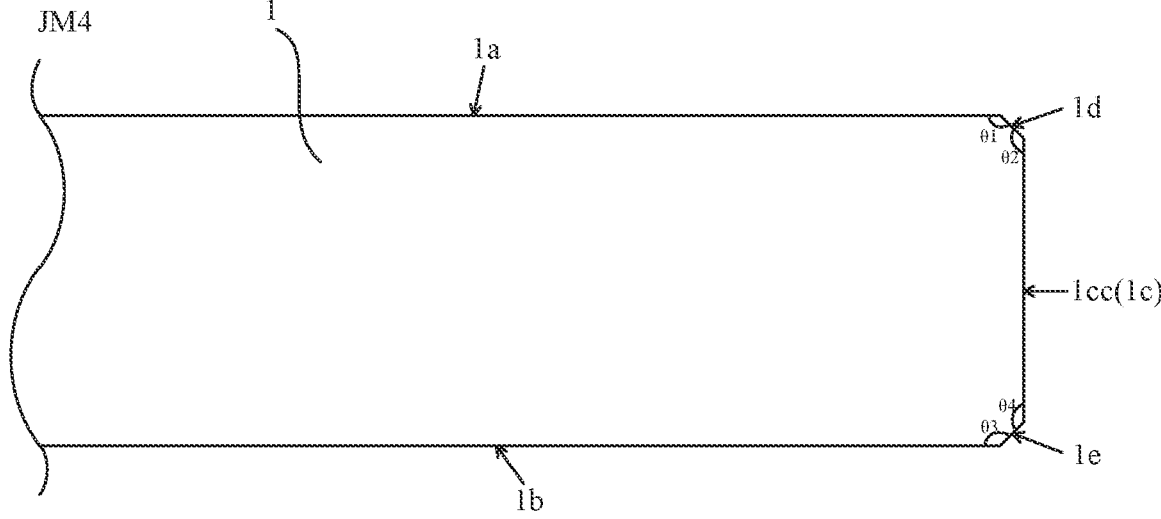
FIG. 4A is a structural diagram of a backplane of a display panel, in accordance with some embodiments of the present disclosure.
Figure 4B:
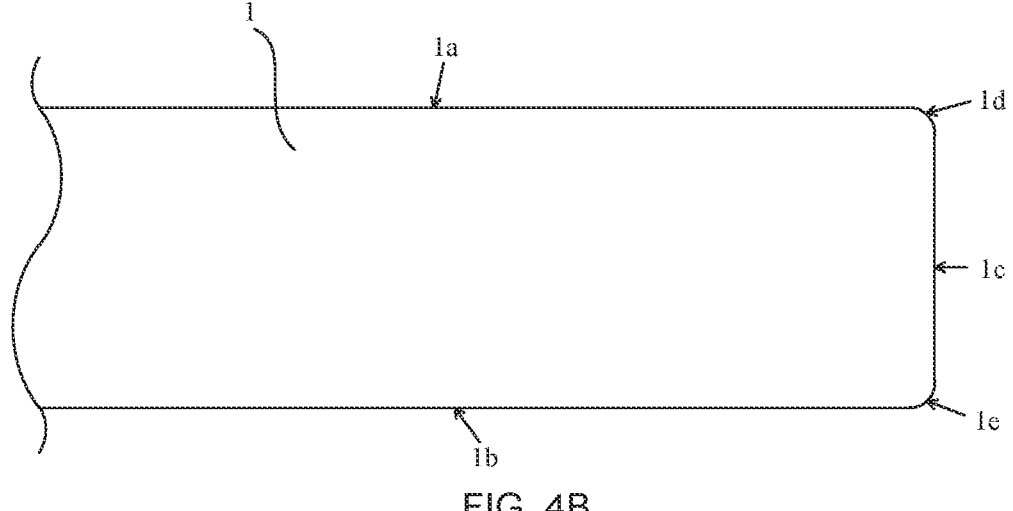
FIG. 4B is another structural diagram of a backplane of a display panel, in accordance with some embodiments of the present disclosure.
Figure 4C:
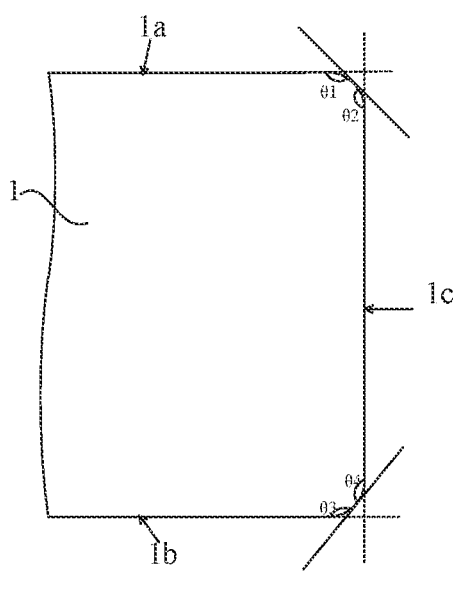
FIG. 4C is a partial enlarged view of the backplane of the display panel shown in FIG. 3.
Figure 5:
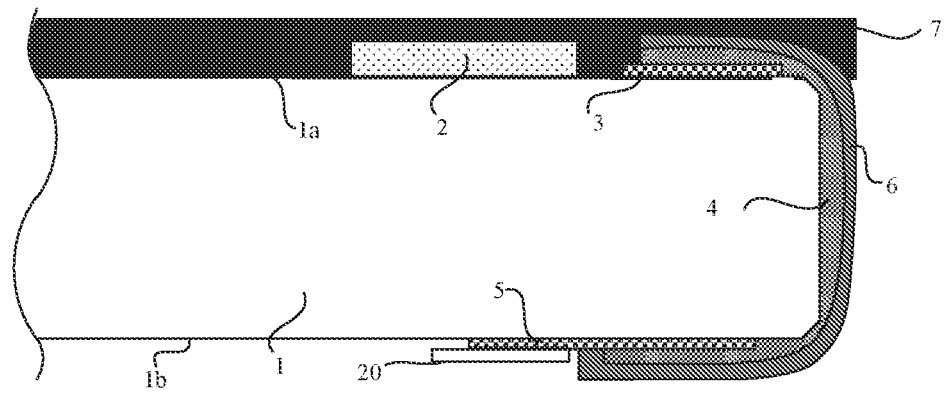
FIG. 5 is a sectional view of a display panel, in accordance with some embodiments of the present disclosure.

FIG. 1 is a plan view of the display panel 10, and FIGS. 2A, 2B, 3, 5 and 7 are sectional views of the display panel 10 that are obtained according to FIG. 1. A first electrode 3, a light-emitting device 2, a connection lead 4 and other structures of the display panel shown in FIG. 5 are omitted in a backplane 1 shown in FIG. 2A, 2B, 20, 3, 4A, 4B or 4C, so as to facilitate display and description of a structure of the backplane 1.

Some embodiments of the present disclosure provide the display panel 10. As shown in FIG. 1, the display panel 10 has a device region AA and an edge region BB located around the device region AA.

Some embodiments of the present disclosure provide the display panel. As shown in FIG. 1, the display panel 10 includes the backplane 1, a plurality of light-emitting devices 2, a plurality of first electrodes 3, and a plurality of connection leads 4.

Referring to FIGS. 4A to 4C, the backplane 1 includes a first main surface 1a and a second main surface 1b opposite to each other, and a plurality of side surfaces 1c connecting the first main surface 1a and the second main surface 1b. At least one of the plurality of side surfaces 1c is a selected side surface 1cc. As shown in FIG. 1, the backplane 1 includes four side surfaces 1c, and two opposite side surfaces 1c are selected side surfaces 1cc.

As shown in FIGS. 1 and 5, the plurality of light-emitting devices 2 are disposed on the first main surface 1a of the backplane 1. The light-emitting device 2 is, but is not limited to, an organic light-emitting diode (OLED), a mini light-emitting diode (Mini LED), or a micro light-emitting diode (Micro LED).

The plurality of first electrodes 3 are disposed on the first main surface 1a of the backplane 1, and are closer to the selected side surface(s) 1cc than the plurality of light-emitting devices 2. The plurality of first electrodes 3 are electrically connected to the plurality of light-emitting devices 2. For example, the plurality of light-emitting devices 2 are disposed in the device region AA of the display panel 10, and the plurality of first electrodes 3 are disposed in the edge region BB of the display panel 10.

For example, as shown in FIG. 1, first electrodes 3 are disposed at respective positions on the first main surface 1a that are close to a selected side surface 1cc. That is, in four side edges of the second main surface 1b, the first electrodes 3 are closer to a side edge connected to the selected side surface 1cc.

As shown in FIG. 5, the plurality of connection leads 4 are disposed on the second main surface 1b and the selected side surface(s) 1cc of the backplane 1. The connection lead 4 is electrically connected to one of the plurality of first electrodes 3 from the second main surface 1b via the selected side surface 1cc.

The number of the plurality of connection leads 4 is equal to the number of the plurality of first electrodes 3, and each connection lead 4 is electrically connected to a first electrode 3 from the second main surface 1b via the selected side surface 1cc, so that the first electrode 3 is electrically connected from the first main surface 1a of the backplane 1 to the opposite second main surface 1b of the backplane 1.

Figure 7:
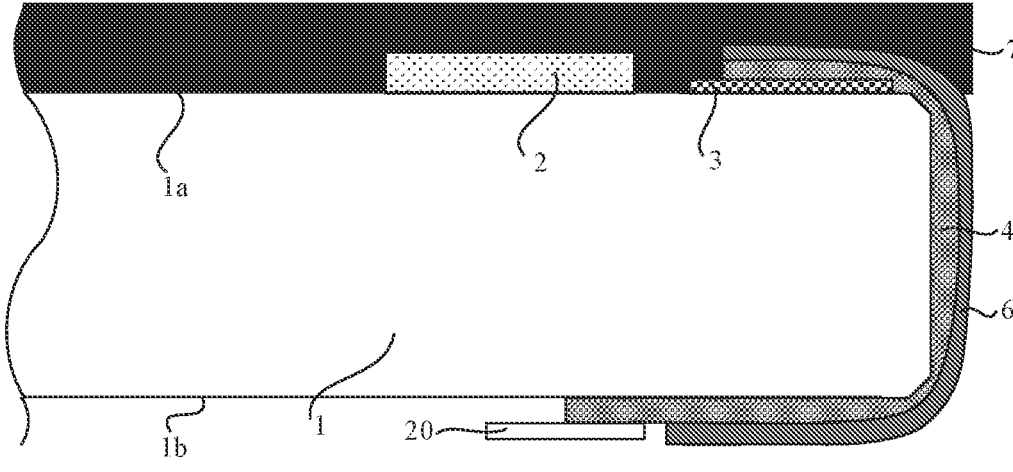
FIG. 7 is another sectional view of a display panel, in accordance with some embodiments of the present disclosure.

In some embodiments, as shown in FIGS. 5 and 7, the display panel 10 further includes a protective adhesive layer 6 covering the plurality of connection leads 4. The protective adhesive layer 6 is disposed on a side of the plurality of connection leads 4 away from the backplane 1. For example, the protective adhesive layer 6 may fill gap regions between the plurality of connection leads 4, and may cover surfaces of the plurality of connection leads 4. The protective adhesive layer 6 is configured to protect the plurality of connection leads 4, and provides electrical insulation and protection against water and oxygen corrosion, so that the plurality of connection leads 4 are prevented from being peeled off, broken or oxidized due to external damage.

For example, the protective adhesive layer 6 is configured to protect the plurality of connection leads 4, and provides the electrical insulation and the protection against the water and oxygen corrosion, so that the plurality of connection leads 4 are prevented from being peeled off, broken or oxidized due to the external damage.

In some embodiments, the protective adhesive layer 6 (referred to as a first protective layer) is, for example, an over coating (OC) adhesive; or the first protective layer 6 is an ink layer.

As shown in FIG. 1, the backplane 1 includes four side surfaces 1c. Two adjacent side surfaces 1c are provided with a transition side surface 1c1 therebetween, and are connected through the transition side surface 1c1.

For example, in a conventional backplane 1, a right angle is formed between two adjacent side surfaces 1c, so that in a transportation process of a display panel, collision is easy to occur, which results in the edge and corner collapsing, thereby affecting the product quality. Moreover, a difficulty of the right-angle grinding is large, and there are a mass of consumables. In the display panel provided in some embodiments of the present disclosure, the two adjacent side surfaces 1c are connected through the transition side surface 1c1 to form a gentle transition, which reduces the problems of collision and edge and corner collapsing caused by excessive stress concentration, so as to improve a reliability and a yield, thereby enhancing a trustworthiness of the display panel.

In some embodiments, the transition side surface 1c1 is a plane, or includes at least two adjacent planes.

As shown in FIG. 2A, FIG. 2A shows a section JM1 of the backplane 1 taken along a plane parallel to the first main surface 1a. In a case where the transition side surface 1c1 is the plane, the transition side surface 1c1 is referred to as a chamfer between the two adjacent side surfaces of the backplane 1. In the section JM1 of the backplane 1 taken along the plane parallel to the first main surface 1a, the transition side surface 1c1 is the plane, and an angle θ5 (or θ6) formed between the transition side surface 1c1 and a side surface 1c adjacent thereto is greater than 90°, e.g., θ5 is 135°. In this way, compared with a right angle, the two adjacent side surfaces 1c may be gently transitioned through the transition side surface 1c1, so that the problems of collision and edge and corner collapsing caused by excessive stress concentration of edges and corners are reduced, thereby enhancing the trustworthiness of the display panel.

As shown in FIGS. 2B and 2C, FIG. 2B shows a section JM2 of the backplane 1 taken along the plane parallel to the first main surface 1a, and FIG. 2C is a partial enlarged view according to the sectional view of the backplane in FIG. 2B. In a case where the transition side surface 1c1 includes the at least two adjacent planes, a plane in the at least two planes connected to the side surface 1c is referred to as a first plane 1c11, and the remaining plane(s) are second plane(s) 1c12. In the section JM2 of the backplane 1 taken along the plane parallel to the first main surface 1a, an angle θ7 (or θ8) formed between a first plane 1c11 and a side surface 1c adjacent thereto is greater than 90°, and an angle θ9 formed between two adjacent planes in the transition side surface

1c1 is greater than 90°, e.g., θ9 is 150°. In this way, the two adjacent side surfaces 1c may be gently transitioned and connected by the at least two adjacent planes, so that stress is able to be further dispersed, and the problems of collision and edge and corner collapsing caused by excessive stress concentration are reduced, thereby enhancing the reliability of the display panel.

In some embodiments, the transition side surface 1c1 is an arc surface.

Figure 3:
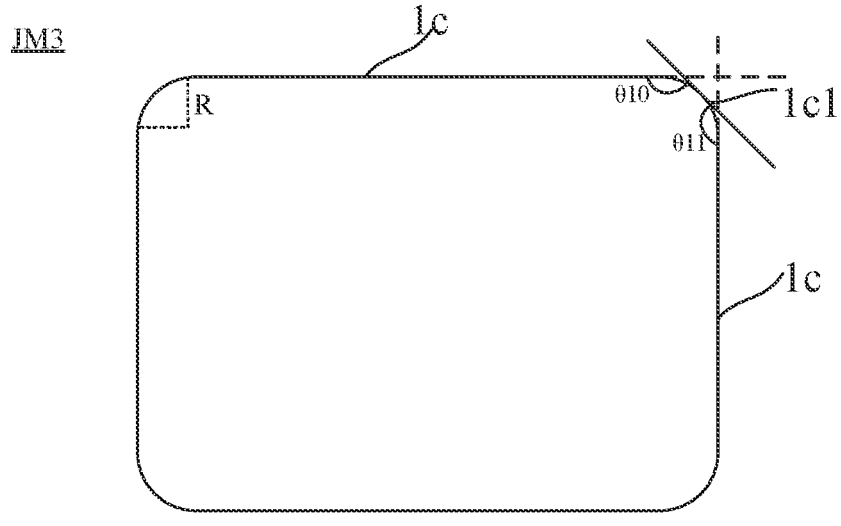
FIG. 3 is a sectional view of yet another backplane of a display panel, in accordance with some embodiments of the present disclosure.

As shown in FIG. 3, FIG. 3 shows a section JM3 of the backplane 1 taken along the plane parallel to the first main surface 1a. In a case where the transition side surface 1c1 is the arc surface, the transition side surface 1c1 is referred to as a fillet between the two adjacent side surfaces 1c of the backplane 1. In the section JM3 of the backplane 1 taken along the plane parallel to the first main surface 1a, an angle θ10 (or θ11) formed between a tangent line at any point on the transition side surface 1c1 and each of two side surfaces adjacent thereto is greater than 90°, e.g., θ10 is 135°. In this way, the two adjacent side surfaces 1c may be gently transitioned and connected by the transition side surface 1c1, so that stress is able to be further dispersed, and the problems of collision and edge and corner collapsing caused by excessive stress concentration are reduced, thereby enhancing the reliability of the display panel.

In some embodiments, as shown in FIGS. 1 and 3, the transition side surface 1c1 is an arc surface. An orthographic projection of the transition side surface 1c1 on a plane where the first main surface 1a is located is a circular arc. Similarly, the transition side surface 1c1 is an arc in the section JM3 of the backplane 1 taken along the plane parallel to the first main surface 1a. The arc is a circular arc whose radius R is in a range of 65 μm to 75 μm. For example, the radius R of the circular arc is 65 μm, 70 μm, or 75 μm.

In some embodiments, the backplane is obtained by grinding an initial backplane. In a process of grinding the initial backplane, compared with the right-angle grinding, the transition side surface is formed between the two side surfaces, for example, the initial backplane is subjected to a radius grinding, so that a service life of a grinding rod is improved, and each grinding rod is able to grind more initial backplanes.

In some embodiments, referring to FIGS. 4A to 4C, the side surface 1c and the first main surface 1a of the backplane 1 are provided with a first transition sub-surface 1d therebetween, and the first main surface 1a and the side surface 1c are connected through the first transition sub-surface 1d.

In a section JM4 of the backplane 1 taken along a plane perpendicular to the first main surface 1a and the side surface 1c, an angle formed between a tangent line at any point on the first transition sub-surface 1d and the first main surface 1a is greater than 90°, and an angle formed between the tangent line at the any point on the first transition sub-surface 1d and the side surface 1c is greater than 90°.

FIGS. 4A to 4C are structural diagrams of the backplane 1 taken along the section line CC in the cross-sectional view of the display panel 10 in FIG. 1. As shown in FIGS. 4A and 4C, the angle θ1 formed between the tangent line at the any point on the first transition sub-surface 1d and the first main surface 1a refers to an included angle towards the interior of the backplane 1, and the angle θ2 formed between the tangent line at the any point on the first transition sub-surface 1d and the side surface 1c refers to an included angle towards the interior of the backplane 1.

In the above backplane 1, the angle formed between the tangent line at the any point on the first transition sub-surface 1d of the backplane 1 and the first main surface 1a is greater than 90°, and the angle formed between the tangent line at the any point on the first transition sub-surface $1d$ of backplane $1$ and the side surface $1c$ is greater than 90°, so that the first main surface $1a$ is able to be gently transitioned to the side surface $1c$ through the first transition sub-surface $1d$, or the side surface $1c$ is able to be gently transitioned to the first main surface $1a$ through the first transition sub-surface $1d$. Thus, compared with a case that the first transition sub-surface $1d$ is not disposed, i.e., a case that the first main surface $1a$ is directly connected to the side surface $1c$ (in this case, an angle formed between the first main surface $1a$ and the side surface $1c$ is 90°), a strength of a side edge of the backplane is enhanced, and the stress concentration of the edges and corners is reduced, so that the edges and corners are not easy to collide and collapse, and in a subsequent process of forming the plurality of connection leads and the protective adhesive layer $6$ (e.g., made of an ink material), a metal layer may be better deposited or evaporated, and the ink material may be better attached to the metal layer to form the protective adhesive layer $6$. Connection leads $4$ are disposed on the side surface $1c$ and the first transition sub-surface $1d$ of the backplane $1$, and each connection lead $4$ is subjected to less stress at a corner, so that broken leads caused by excessive stress concentration are reduced. In this way, each of the connection leads $4$ is not easily broken at the corner, which ensures that the connection leads $4$ are able to be stably connected to the two opposite main surfaces of the backplane $1$, thereby enhancing the trustworthiness of the display panel $10$.

In some embodiments, referring to FIGS. 4A to 4C, the side surface $1c$ and the second main surface $1b$ of the backplane $1$ are provided with a second transition sub-surface $1e$ therebetween, and the second main surface $1b$ and the side surface $1c$ are connected through the second transition sub-surface $1e$.

In a section of the backplane $1$ taken along a plane perpendicular to the second main surface $1b$ and the side surface $1c$, an angle formed between a tangent line at any point on the second transition sub-surface $1e$ and the second main surface $1b$ is greater than 90°, and an angle formed between the tangent line at the any point on the second transition sub-surface $1e$ and the side surface $1c$ is greater than 90°.

As shown in FIGS. 4A to 4C, the angle $\theta3$ formed between the tangent line at the any point on the second transition sub-surface $1e$ and the second main surface $1b$ refers to an included angle towards the interior of the backplane $1$, and the angle $64$ formed between the tangent line at the any point on the second transition sub-surface $1e$ and the side surface $1c$ refers to an included angle towards the interior of the backplane $1$.

In the above backplane $1$, the angle formed between the tangent line at the any point on the second transition sub-surface $1e$ of the backplane $1$ and the second main surface $1b$ is greater than 90°, and the angle formed between the tangent line at the any point on the second transition sub-surface $1e$ of the backplane $1$ and the side surface $1c$ is greater than 90°, so that the second main surface $1b$ is able to be gently transitioned to the side surface $1c$ through the second transition sub-surface $1e$, or the side surface $1c$ is able to be gently transitioned to the second main surface $1b$ through the second transition sub-surface $1e$. Thus, compared with a case that no second transition sub-surface $1e$ exists and the second main surface $1b$ is directly connected to the side surface $1c$ (in this case, an angle formed between the second main surface $1b$ and the side surface $1c$ is 90°), the strength of the side edge of the backplane is enhanced, and the stress concentration of the edges and the corners is reduced, so that the edges and corners are not easy to collide and collapse, and in the subsequent process of forming the plurality of connection leads and the protective adhesive layer $6$ (e.g., the ink layer), the metal layer may be better deposited or evaporated, and the ink material may be better attached to the metal layer to form the protective adhesive layer $6$. Connection leads $4$ are disposed on the second main surface $1b$, the second transition sub-surface $1e$, the side surface $1c$ and the first transition sub-surface $1d$ of the backplane $1$, and each connection lead $4$ is subjected to less stress at a corner, so that broken leads caused by excessive stress concentration are reduced. In this way, each of the connection leads $4$ is not easily broken at the corner, which further ensures that the connection leads $4$ are able to be stably connected to the two opposite main surfaces of the backplane $1$, thereby further enhancing the reliability of the display panel $10$.

In some embodiments, the first transition sub-surface $1d$ and the second transition sub-surface $1e$ each are a plane or an arc surface.

In a case where the first transition sub-surface $1d$ and the second transition sub-surface $1e$ are planes, the first transition sub-surface $1d$ is referred to as a chamfer of the first main surface $1a$ and the side surface $1c$, and the second transition sub-surface $1e$ is referred to as a chamfer of the second main surface $1b$ and the side surface $1c$. The angle $\theta1$ formed between the first transition sub-surface $1d$ and the first main surface $1a$ is greater than 90°, e.g., $\theta1$ is 135°. The angle $\theta2$ formed between the first transition sub-surface $1d$ and the side surface $1c$ is greater than 90°, e.g., $\theta2$ is 135°. The angle $\theta3$ formed between the second transition sub-surface $1e$ and the second main surface $1b$ is greater than 90°, e.g., $\theta3$ is 135°. The angle $\theta4$ formed between the second transition sub-surface $1e$ and the side surface $1c$ is greater than 90°, e.g., $\theta4$ is 135°.

In a case where the first transition sub-surface $1d$ and the second transition sub-surface $1e$ are arc surfaces, the first transition sub-surface $1d$ is referred to as a fillet of the first main surface $1a$ and the side surface $1c$, and the second transition sub-surface $1e$ is referred to as a fillet of the second main surface $1b$ and the side surface $1c$. For example, as shown in FIGS. 4B and 4C, a tangent line is formed at a point of the first transition sub-surface $1d$ (the arc surface) located at a middle position. An angle $\theta1$ formed between this tangent line and the first main surface $1a$ is 135°, and an angle $\theta2$ formed between this tangent line and the side surface $1c$ is 135°. A tangent line is formed at a point of the second transition sub-surface $1e$ (the arc surface) located at a middle position. An angle $\theta3$ formed between this tangent line and the second main surface $1b$ is 135°, and an angle $\theta4$ formed between this tangent line and the side surface $1c$ is 135°. The connection leads $4$ are disposed on the arc surface, and stress is able to be further dispersed, so as to further avoid the problem of broken leads caused by excessive stress concentration.

Figure 8:
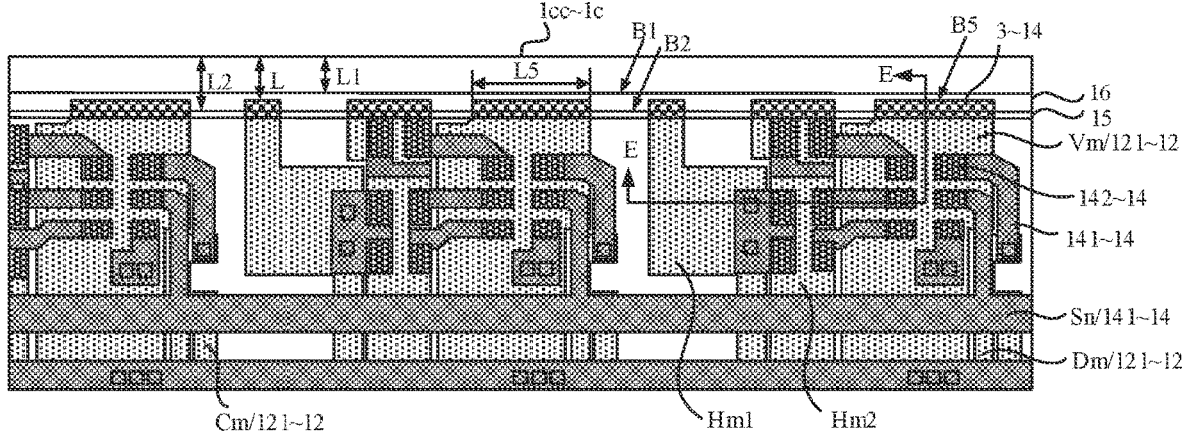
FIG. 8 is a front view of a backplane, in accordance with some embodiments of the present disclosure.

In some embodiments, as shown in FIGS. 1 and 8, first electrodes $3$ are arranged side by side, and ends of the first electrodes $3$, each of which is an end of a first electrode $3$ facing a selected side surface, are located on a straight line. That is, the ends of the first electrodes $3$, each of which is the end of the first electrode $3$ facing the selected side surface, are flush. A vertical distance L between an end of each of the first electrodes $3$ proximate to the selected side surface $1cc$ and a plane where the selected side surface $1cc$ is located is in a range of 60 μm to 80 μm. For example, the vertical distance L is 60 μm, 70 μm, or 80 μm.

In some examples, as shown in FIG. 1, the transition side surface 1c1 is an arc surface, and the orthographic projection of the transition side surface 1c1 is the circular arc. A radius R of the circular arc is related to the vertical distance L. For example, the radius R of the circular arc is equal to the vertical distance L, and both are 70 μm.

In some embodiments, as shown in FIG. 5, the display panel 10 further includes a plurality of second electrodes 5 disposed on the second main surface 1b of the backplane 1. The plurality of second electrodes 5 are configured to be electrically connected to a driving chip or a flexible printed circuit. The connection lead is further electrically connected to one of the plurality of second electrodes 5.

The plurality of second electrodes 5 are disposed on the second main surface 1b of the backplane 1, and are configured to be electrically connected to the driving chip or the flexible printed circuit. That is, the plurality of second electrodes 5 are used to be bonded to the driving chip or the flexible printed circuit. In some examples, the second main surface 1b of the backplane 1 has a bonding region, and at least a portion of each of the plurality of second electrodes 5 is located in the bonding region. The plurality of second electrodes 5 are bonded to the driving chip or the flexible printed circuit in the bonding region. In some other examples, the plurality of second electrodes 5 are electrically connected to the bonding region through respective connection lines, and are bound to the driving chip or the flexible printed circuit through the respective connection lines. Thus, the driving chip or the flexible printed circuit is able to be disposed on a back surface of the display panel 10, and is electrically connected to a front surface of the display panel 10 through the plurality of second electrodes 5, the plurality of connection leads and the plurality of first electrodes 3, thereby controlling the light-emitting devices 2 to emit light to realize display.

The number of the plurality of second electrodes 5 is equal to the number of the plurality of connection leads 4. An end of each connection lead 4 is electrically connected to the first electrode 3, and another end of the connection lead 4 is electrically connected to the second electrode 5. The plurality of first electrodes 3 and the plurality of second electrodes 5 may be connected in one-to-one correspondence through the plurality of connection leads 4 to realize signal transmission.

In some embodiments, as shown in FIG. 7, a portion of each of the plurality of connection leads 4 located on the second main surface 1b of the backplane 1 is configured to be bonded to the driving chip or the flexible printed circuit. That is, the display panel 10 does not include the plurality of second electrodes 5, and the driving chip or the flexible printed circuit in the display device 100 is directly bonded to the portion of each of the plurality of connection leads 4 located on the second main surface 1b of the backplane 1, so that the driving chip or the flexible printed circuit is able to be disposed on the back surface of the display panel 10, and is electrically connected to the front surface of the display panel 10 through the plurality of connection leads and the plurality of first electrodes 3, thereby controlling the light-emitting devices 2 to emit light to realize display.

In the above scheme of directly bonding the driving chip or the flexible printed circuit by using the plurality of connection leads 4, the manufacturing of the plurality of second electrodes 5 may be omitted to simplify the manufacturing process of the display panel 10 and improve the manufacturing efficiency, and contact resistances between the plurality of second electrodes and the plurality of connection leads may be avoided, which is conducive to the electrical signal transmission.

In some embodiments, as shown in FIG. 1, first electrodes 3 in the plurality of first electrodes 3 that are adjacent to the same side surface 1c extend in a direction perpendicular to a border of the backplane where this side surface 1c is located, and are arranged at equal intervals in a direction parallel to the border of the backplane 1 where this side surface 1c is located.

Figure 6:
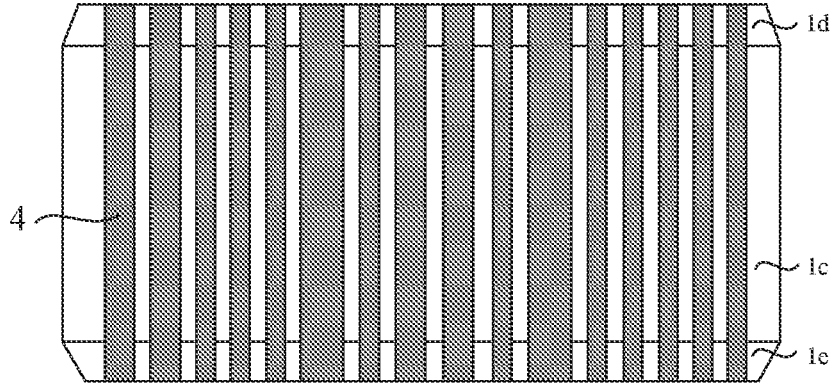
FIG. 6 is a side view of the display panel shown in FIG. 5.

In some examples, as shown in FIGS. 1 and 6, connection leads 4 in the plurality of connection leads 4 that are disposed on the same side surface 1c are arranged at equal intervals in a direction parallel to the border of the backplane where this side surface 1c is located.

A structural diagram of film layers located on the front surface of the display panel, i.e., a structural diagram of film layers located on a side of the backplane where the first main surface is located, will be described below.

Figure 9:
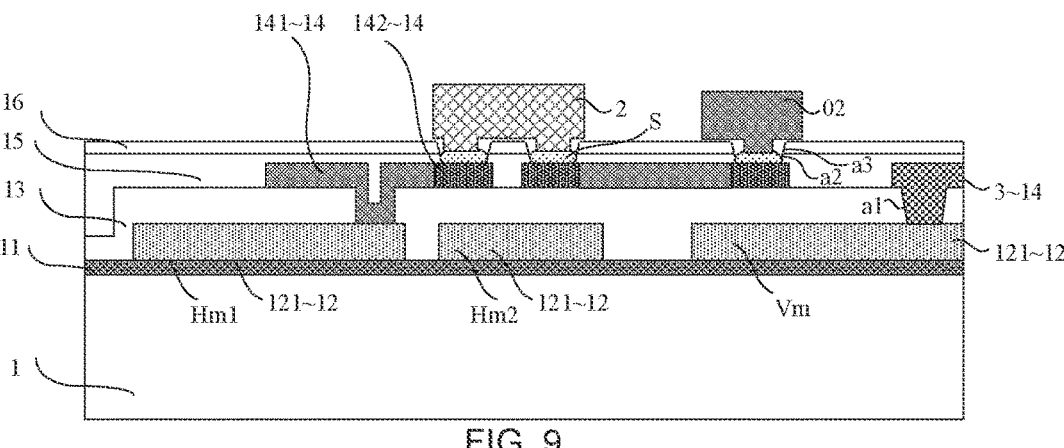
FIG. 9 is a sectional view taken along the section line EE in FIG. 8.

In some embodiments, as shown in FIGS. 8 and 9, the display panel 10 includes a buffer layer 11, a first metal layer 12, an insulating layer 13, a second metal layer 14, a planarization layer 15 and a passivation layer 16. It will be noted that FIG. 8 schematically shows a structural diagram of the film layers until the passivation layer 16 is manufactured in a process of manufacturing the film layers of the display panel 10. As shown in FIG. 8, borders of the passivation layer 16 are flat, and the passivation layer 16 covers the plurality of first electrodes. In a subsequent process, a portion of the passivation layer 16 is etched and removed to expose the first electrodes 3, so that the connection leads are respectively connected to the first electrodes 3.

The buffer layer 11 is disposed on the first main surface 1a of the backplane 1. The first metal layer 12 is disposed on a side of the buffer layer 11 away from the backplane 1, and the first metal layer 12 includes a plurality of first signal lines 121. The insulating layer 13 is disposed on a side of the first metal layer 12 away from the backplane 1. The second metal layer 14 is disposed on a side of the insulating layer 13 away from the backplane 1, and the second metal layer 14 includes the plurality of first electrodes 3 and a plurality of second signal lines 141. The planarization layer 15 is disposed on a side of the second metal layer 14 away from the backplane 1. The passivation layer 16 is disposed on a side of the planarization layer 15 away from the backplane 1.

In some examples, as shown in FIG. 8, a border B1 of the passivation layer 16 is closer to a side surface 1c of the backplane 1 than a border B2 of the planarization layer 15 located on the same side as the border B1 of the passivation layer 16.

As a possible design, the planarization layer 15 covers a portion of the plurality of first electrodes 3 to protect the plurality of first electrodes 3. The border B1 of the passivation layer 16 is closer to a selected side surface 1cc of the backplane 1 than a border B5 of the plurality of first electrodes 3 located on the same side as the border B1 of the passivation layer 16.

For example, as shown in FIG. 8, a distance between the border B2 of the planarization layer 15 and a side surface of the backplane 1 to which the border B2 of the planarization layer 15 is adjacent is L2. A distance between the border B1 of the passivation layer 16 and the side surface 1c of the backplane 1 to which the border B1 of the passivation layer 16 is adjacent is L1, and L2 is greater than L1 (i.e., L2>L1).

As a possible design, as shown in FIG. 9, the insulating layer 13 includes a plurality of first vias a1, and the plurality of first vias a1 each penetrate to the first metal layer 12. For example, the first electrode 3 is connected to the first signal line 121 through a first via a1.

As a possible design, the buffer layer 11 and the insulating layer 13 are made of a same material. For example, the buffer layer 11 and the insulating layer 13 are made of silicon nitride. The material of the passivation layer 16 includes at least one of silicon nitride and silicon oxide. For example, the material of the planarization layer 15 is an organic material, e.g., resin.

Figure 10:
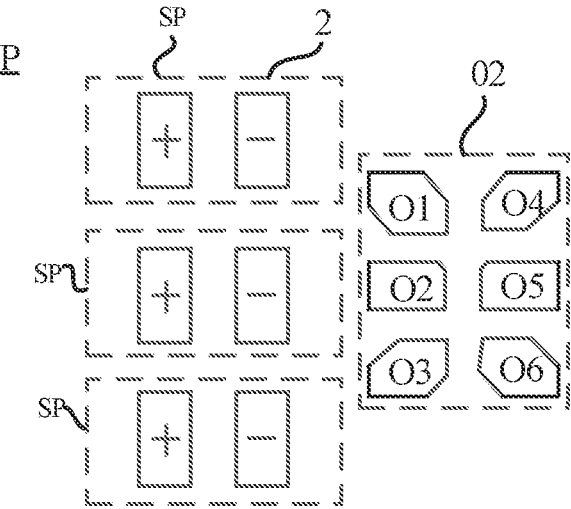
FIG. 10 is a structural diagram of a pixel in a display panel, in accordance with some embodiments of the present disclosure.

In some embodiments, the display panel 10 includes a plurality of pixels P arranged in an array, and the plurality of pixels P are arranged in N rows and M columns. As shown in FIG. 10, each pixel P includes at least two light-emitting devices 2 and a pixel driving chip 02. Each pixel P includes a plurality of sub-pixels SP, such as three sub-pixels SP, and each sub-pixel SP includes at least one light-emitting device 2. The light-emitting devices 2 and the pixel driving chip 02 are disposed on a side of the passivation layer 16 away from the backplane.

In some embodiments, as shown in FIGS. 8 and 9, the second metal layer 14 further includes a plurality of connection pads 142, and the plurality of connection pads 142 are used for connecting the light-emitting devices 2 to the pixel driving chip 02. Pins of the light-emitting device 2 and pins of the pixel driving chip 02 are connected to corresponding connection pads 142 by a soldering material S (e.g., soldering tin, tin-silver-copper alloy or tin-copper alloy). The planarization layer 15 includes a plurality of second vias a2 penetrating therethrough to the second metal layer 14. The passivation layer 16 includes a plurality of third vias a3 penetrating therethrough to the planarization layer 15. A third via a3 corresponds to a second via a2 to form a through hole penetrating from the passivation layer 16 to the connection pad 142 in the second metal layer 14.

For example, the pins of the light-emitting device 2 are respectively connected to two connection pads 142 through respective through holes penetrating the planarization layer 15 and the passivation layer 16. The pins of the pixel driving chip 02 are respectively connected to six connection pads 142 through respective through holes penetrating the planarization layer 15 and the passivation layer 16. Thus, under a control of signals transmitted by signal lines and the pixel driving chip 02, the light-emitting device 2 is able to emit light.

Figure 11:
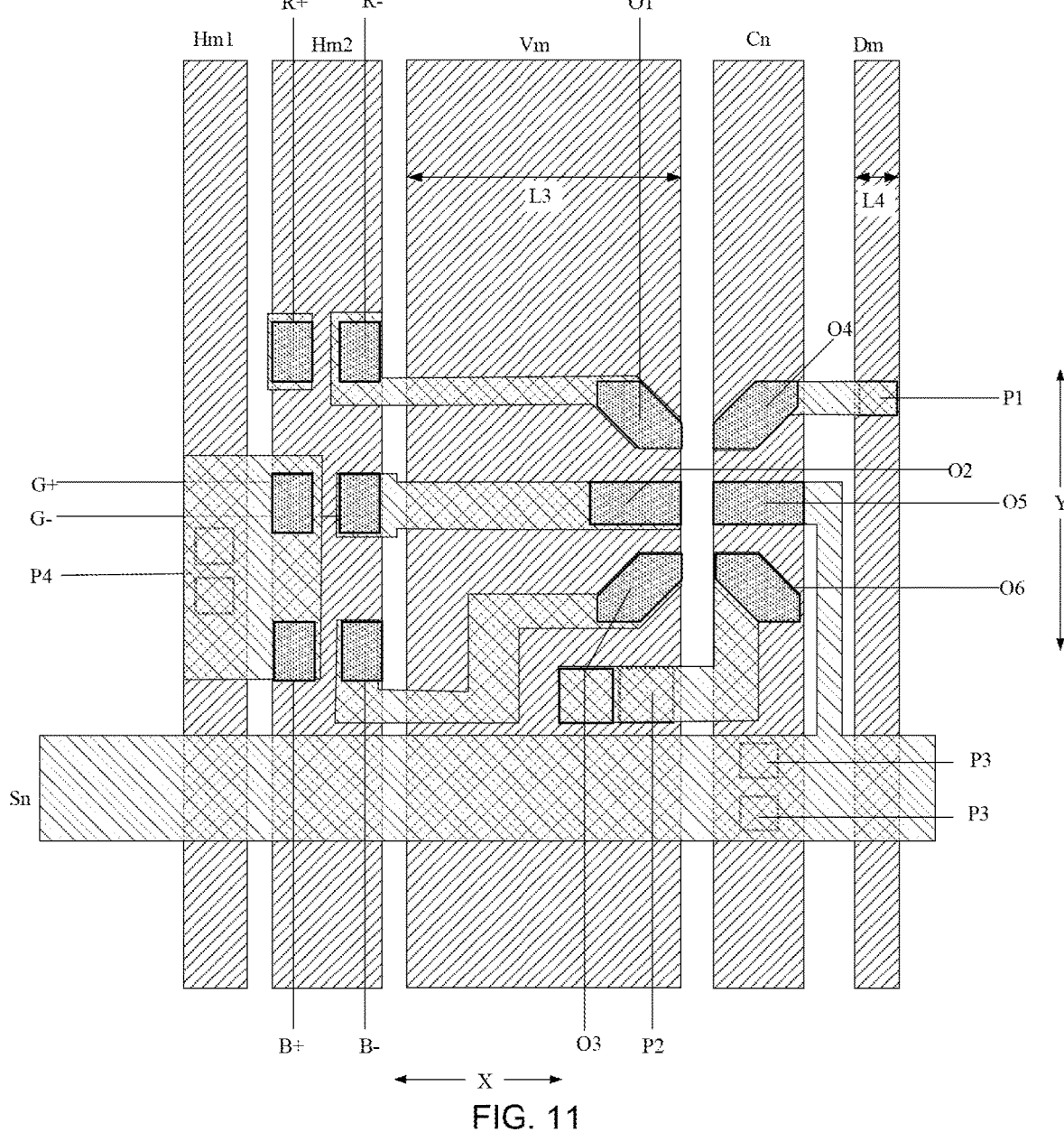
FIG. 11 is a diagram showing an array layout corresponding to a pixel in a display panel, in accordance with embodiments of the present disclosure.

In an embodiment, as shown in FIGS. 8, 9 and 11, the first metal layer 12 includes the plurality of first signal lines 121, and the first signal lines 121 include a plurality of data signal lines Dm, a plurality of first positive signal lines Hm1, a plurality of second positive signal lines Hm2, a plurality of reference signal lines Vm and a plurality of scan signal transfer lines Cn that all extend in a first direction Y. The second metal layer 14 includes a plurality of scan signal lines Sn, and each scan signal line Sn is electrically connected to a scan signal transfer line Cn. The plurality of scan signal lines Sn extend in a second direction X.

For example, in the plurality of pixels P arranged in the array, pixels P in each row are electrically connected to a same scan signal line Sn, and pixels P in each column are electrically connected to a data signal line Dm, a reference signal line Vm, a first positive signal line Hm1 and a second positive signal line Hm2, so as to achieve reasonable wiring and transmit corresponding signals to the pixels P through a plurality of signal lines.

As shown in FIGS. 10 and 11, each of the plurality of pixels P includes sub-pixels SP with at least three colors and the pixel driving chip 02 for driving the sub-pixels SP to emit light. Each sub-pixel SP includes at least one light-emitting device 2, and the light-emitting device 2 may be, for example, an inorganic light-emitting diode. A description will be made in an example where each pixel P includes three sub-pixels SP, and each sub-pixel SP includes a light-emitting device 2. The three light-emitting devices 2 in the figure are arranged in three rows, and the light-emitting devices 2 in the three rows are sequentially a first color light-emitting device 2, a second color light-emitting device 2 and a third color light-emitting device 2 from top to bottom.

The pixel driving chip 02 is electrically connected to a negative electrode of the light-emitting device 2 in each of the sub-pixels SP driven by this pixel driving chip 02, at least one data signal line Dm in the plurality of data signal lines, at least one scan signal line Sn in the plurality of scan signal lines, and at least one reference signal line Vm in the plurality of reference signal lines. The pixel driving chip 02 is configured to write signal(s) of the data signal line(s) Dm into the sub-pixels SP with different colors in time division under a control of the scan signal line(s) Sn. The reference signal line Vm is configured to provide a negative signal to the pixel driving chip 02, so that a current path is formed between the pixel driving chip 02 and the light-emitting device 2.

Referring to FIGS. 10 and 11, the pixel driving chip 02 has a first signal terminal O1, a second signal terminal O2, a third signal terminal O3, a fourth signal terminal O4, a fifth signal terminal O5 and a sixth signal terminal O6. The first signal terminal O1 is connected to a negative electrode R− of the first color light-emitting device 2, the second signal terminal O2 is connected to a negative electrode G− of the second color light-emitting device 2, the third signal terminal O3 is connected to a negative electrode B− of the third color light-emitting device 2, the fourth signal terminal O4 is electrically connected to the data signal line Dm through a via P1, the fifth signal terminal O5 is connected to the scan signal line Sn, and the sixth signal terminal O6 is connected to the reference signal line Vm through a via P2. A positive electrode R+ of the first color light-emitting device 2 is connected to the second positive signal line Hm2, a positive electrode G+ of the second color light-emitting device 2 is connected to the first positive signal line Hm1 through a via P4, and a positive electrode B+ of the third color light-emitting device 2 is connected to the first positive signal line Hm1 through a via P4. The scan signal line Sn is connected to the scan signal transfer line Cn through via(s) P3.

In some embodiments, the plurality of first signal lines 121 extend in the first direction Y, and each first signal line 121 is electrically connected to a first electrode 3 through a first via a1 penetrating the insulating layer 13. A dimension L5 of the first electrode 3 in the second direction is positively correlated with an average width of the first signal line 121 connected to the first electrode 3 in the second direction X. The first direction is perpendicular to the second direction.

In some examples, the first signal line 121 is not a signal line with a uniform width. In order to facilitate reasonable layout of the signal lines, the first signal line 121 has large widths at some positions, and has small widths at some positions. The average width of the first signal line 121 in the second direction X refers to a value obtained by performing weighted summation on the widths of the first signal line 121 at the positions.

Referring to FIGS. 9 and 11, in some embodiments, since the signal lines connected to the pixel P provide different signals, respective line widths thereof are different. A width of the first electrode 3 is the same as or substantially the same as a width of a signal line to which the first electrode 3 is electrically connected. The width of the signal line refers to a width of the signal line in a direction perpendicular to an extending direction (e.g., the first direction Y) of a main body of the signal line, i.e., a dimension of the signal line in the second direction X. The width of the first electrode 3 refers to the dimension of the first electrode 3 in the second direction X. For example, a width of a first electrode 3 electrically connected to the reference signal line Vm is equal to a width of the reference signal line Vm, or is slightly greater than the width of the reference signal line Vm. As shown in FIG. 11, the width L3 of the reference signal line Vm is greater than a width L4 of the data signal line Dm, and the width of the first electrode 3 electrically connected to the reference signal line Vm is greater than a width of a first electrode 3 electrically connected to the data signal line Dm. As shown in FIGS. 8, 9 and 11, widths of the plurality of first electrodes 3 are different, a width of each first electrode 3 corresponds to a width of a signal line to which this first electrode 3 is electrically connected, and widths of first electrodes 3 respectively electrically connected to signal lines with different widths are different.

In some embodiments, as shown in FIGS. 5 and 7, the display panel 10 further includes a second protective layer 7 disposed on the first main surface 1a of the backplane 1. The second protective layer 7 covers the plurality of light-emitting devices 2, and fills gap regions between the plurality of light-emitting devices 2.

In some embodiments, the second protective layer 7 further covers a portion of the first protective layer 6 located on the first main surface 1a, so as to further protect the circuit structures, e.g., protect the plurality of light-emitting devices 2, so as to prevent the light-emitting devices 2 from being collided and damaged in a subsequent process.

In some examples, as shown in FIGS. 5 and 7, a material of the second protective layer 7 has a high light transmittance and a dark color. For example, the material of the second protective layer 7 may be black silica gel or black resin. In this way, the plurality of light-emitting devices 2 are protected, and the light-emitting efficiency of the plurality of light-emitting devices 2 is ensured. Moreover, a reduced image contrast due to a fact that external ambient light is reflected after being irradiated to the display panel 10 such as metal material patterns is avoided, so that the contrast is improved.

Figure 12:
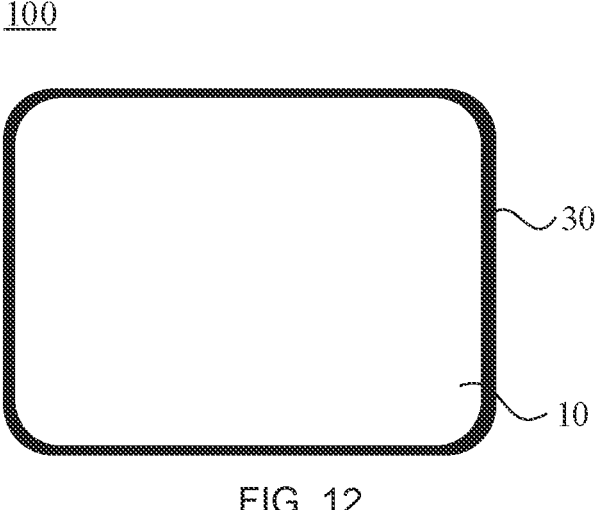
FIG. 12 is a structural diagram of a display device, in accordance with some embodiments of the present disclosure.

Some embodiments of the present disclosure further provide a display device 100. As shown in FIG. 12, the display device 100 includes the display panel 10 and a housing 30 disposed on a periphery of the display panel. The housing 30 is used for protecting the display panel and providing an external device such as a driving chip.

As shown in FIGS. 5 and 7, the display device includes the display panel 10 and the driving chip 20.

The driving chip 20 is disposed on the second main surface 1b of the backplane 1 in the display panel 10, and is electrically connected to the plurality of first electrodes 3 in the display panel 10 through the plurality of connection leads 4 in the display panel 10. In some embodiments, as shown in FIG. 5, in a case where the display panel 10 further includes the second electrodes 5, the plurality of second electrodes 5 are respectively electrically connected to the plurality of connection leads 4. The driving chip 20 is electrically connected to the plurality of second electrodes 5 to be electrically connected to the plurality of connection leads 4 through the plurality of second electrodes 5. It can be understood that a thickness of the second electrode 5 at a position where the second electrode 5 is bonded to the driving chip 20 may be the same as a thickness of the second electrode 5 at another position. The thickness of the second electrode 5 at the position where the second electrode 5 is bonded to the driving chip 20 may be less than the thickness of the second electrode 5 at the another position.

In some other embodiments, as shown in FIG. 7, in a case where the display panel 10 does not include the second electrodes 5, the driving chip 20 is directly electrically connected to the portion of each of the plurality of connection leads 4 located on the second main surface 1b of the backplane 1.

Beneficial effects that can be achieved by the display device 100 in the above embodiments of the present disclosure are the same as the beneficial effects that can be achieved by the display panel 10, and will not be repeated here.

In some embodiments, the display device 100 may be a Mini LED display device or a Micro LED display device.

The above display device 100 may be any device that displays images whether moving (e.g., videos) or stationary (e.g., still images), or text. More specifically, it is anticipated that the embodiments may be implemented in, or associated with, a variety of electronic devices. The variety of electronic devices are, for example (but not limit to), mobile phones, wireless devices, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

Some embodiments of the present disclosure further provide a manufacturing method of a display panel, and the manufacturing method is used for manufacturing the display panel described above in the present disclosure. As shown in FIG. 13, the manufacturing method includes following steps.

In S1, an initial backplane 1' is provided. As shown in FIGS. 14A and 16A, the initial backplane 1' includes a first main surface 1a' and a second main surface 1b' opposite to each other, and a plurality of side surfaces 1c' connecting the first main surface 1a' and the second main surface 1b'. The plurality of side surfaces 1c' are perpendicular to or substantially perpendicular to the first main surface 1a' and the second main surface 1b'.

For example, the initial backplane 1' is a glass plate. It will be noted that the first main surface 1a' and the second main surface 1b' of the initial backplane correspond to the first main surface 1a and the second main surface 1b of the finally obtained backplane, respectively. A right angle is formed between two adjacent side surfaces of the initial backplane, a right angle is formed between the first main surface and the side surface, and a right angle is formed between the second main surface and the side surface.

In S2, a plurality of first electrodes 3 are formed on the first main surface 1a' of the initial backplane 1'. The plurality of first electrodes 3 are adjacent to at least one side surface 1c' in the plurality of side surfaces 1c', and the at least one side surface 1c' is a selected side surface 1c'.

The at least one side surface 1c' includes side surface(s) 1c' for providing a plurality of connection leads 4 in a subsequent step, which are referred to selected side surface (s) 1c'. The plurality of first electrodes 3 are adjacent to side edge(s) respectively connected to the selected side surface(s) 1c' in side edges of the first main surface 1a'. For example, the initial backplane 1' has four side surfaces 1c', and one, two, or three side surfaces 1c' in the four side surfaces 1c' are selected side surfaces 1c', or the four side surfaces 1c' are selected side surfaces 1c'. The plurality of first electrodes 3 are respectively formed at positions of the first main surface 1a' of the initial backplane 1' adjacent to the selected side surface(s) 1c'.

Figure 16C:
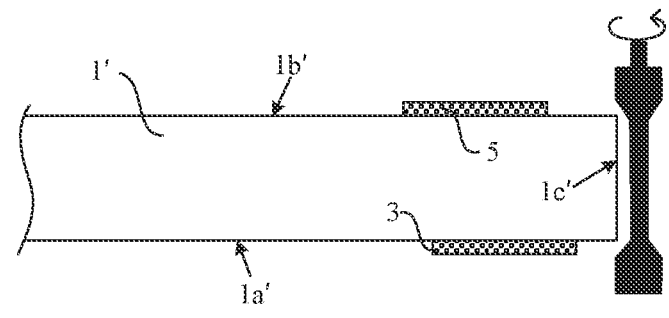
Figure 16D:
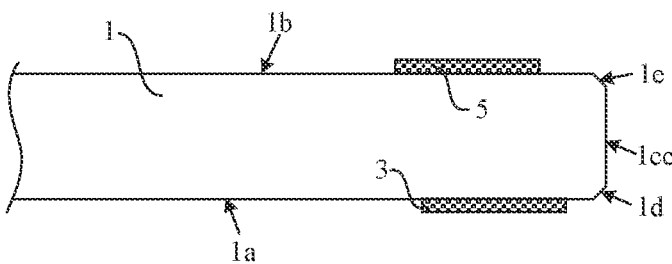

In S3, as shown in FIGS. 14A and 16C, boundary edge(s) B3, each of which is a boundary edge B3 of two adjacent side surfaces 1c', are ground to form transition side surface(s) 1c1 at the respective boundary edge(s) B3, so as to obtain the backplane 1. The backplane 1 includes the plurality of side surfaces 1c connecting the first main surface 1a and the second main surface 1b, and the transition side surface(s) 1c1 each connecting two adjacent side surfaces 1c. At least one side surface 1c of the plurality of side surfaces 1c is a selected side surface 1cc. The first main surface 1a' and the second main surface 1b' of the initial backplane 1' are respectively the first main surface 1a and the second main surface 1b of the backplane 1.

In a section JM1 of the backplane 1 taken along a plane parallel to the first main surface 1a, an angle θ5 (or θ6) formed between the transition side surface 1c1 and a side surface 1c adjacent thereto is greater than 90°.

In some examples, the boundary edge B3 of two adjacent side surfaces 1c' of the initial backplane 1' is ground by a chamfering process to form the transition side surface 1c1.

For example, the transition side surface 1c1 is a plane; or the transition side surface 1c1 includes at least two adjacent planes; or the transition side surface is an arc surface.

In a case where the transition side surface 1c1 includes the at least two adjacent planes, a plane in the at least two planes connected to the side surface 1c is a first plane 1c11. In a section JM2 of the backplane 1 taken along the plane parallel to the first main surface 1a, an angle θ7 (or θ8) formed between a first plane and a side surface 1c adjacent thereto is greater than 90°, and an angle θ9 formed between two adjacent planes in the transition side surface 1c1 is greater than 90°.

In a case where the transition side surface 1c1 is the arc surface, in a section JM3 of the backplane 1 taken along the plane parallel to the first main surface 1a, an angle θ10 (or θ11) formed between a tangent line at any point on the transition side surface 1c1 and each of two side surfaces 1c adjacent thereto is greater than 90°.

In some embodiments, as shown in FIGS. 4A to 4C, and FIGS. 14A, 16C and 16D, S3 further includes: grinding boundary edge(s) B4 each being a boundary edge B4 of the first main surface 1a' and a side surface 1c' to form first transition sub-surface(s) 1d at the respective boundaryqj edge(s) B4, and grinding boundary edge(s) B4 each being a boundary edge B4 of the second main surface 1b' and a side surface 1c' to form second transition sub-surface(s) 1e at the respective boundary edge(s) B4, so as to obtain the backplane 1.

In a section JM4 of the backplane 1 taken along a plane perpendicular to the first main surface 1a and the side surface 1c, an angle θ1 formed between a tangent line at any point on the first transition sub-surface 1d and the first main surface 1a is greater than 90°, and an angle θ2 formed between the tangent line at the any point on the first transition sub-surface 1d and the side surface 1c is greater than 90°. In a section JM4 of the backplane 1 taken along a plane perpendicular to the second main surface 1b and the side surface 1c, an angle θ3 formed between a tangent line at any point on the second transition sub-surface 1e and the second main surface 1b is greater than 90°, and an angle θ4 formed between the tangent line at the any point on the second transition sub-surface 1e and the side surface 1c is greater than 90°.

In some examples, the boundary edge(s) B4, each of which is a boundary edge B4 of the first main surface 1a' and the side surface 1c' of the initial backplane 1' are ground by a chamfering process to form the first transition sub-surface(s) 1d. The boundary edge(s) B4, each of which is a boundary edge B4 of the second main surface 1b' and the side surface 1c' are ground to form the second transition sub-surface(s) 1e at the respective boundary edge(s) B4.

For example, the first transition sub-surface 1d and the second transition sub-surface 1e each are a plane or an arc surface.

In a process of grinding by using the chamfer process, there may be defects such as pits and burrs. For example, there are a plurality of pits on the formed transition side surface 1c1, and a diameter or diagonal length of each pit is within 10 μm. An influence of the plurality of pits on an overall flatness of the transition side surface 1c1 may be negligible.

Figure 14B:
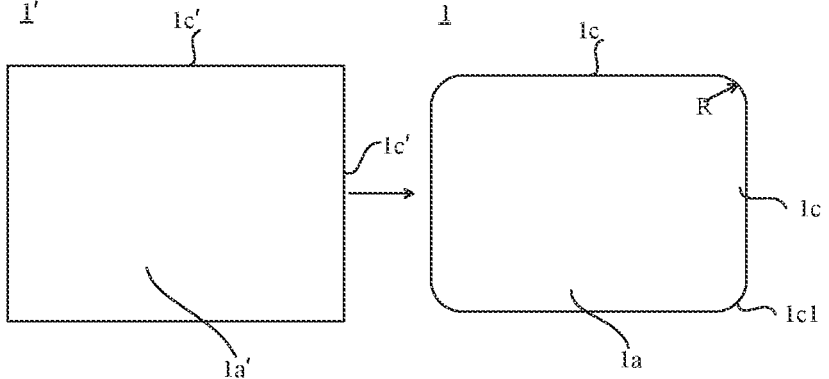
FIG. 14B is a diagram showing front structures of an initial backplane before and after grinding, in accordance with some embodiments of the present disclosure.
Figure 14C:
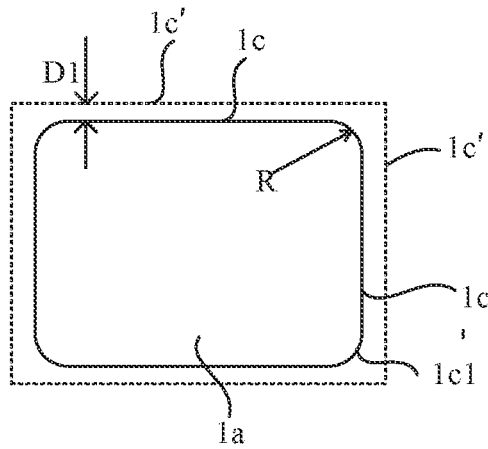
FIG. 14C is a comparison diagram of structures of an initial backplane before and after grinding, in accordance with some embodiments of the present disclosure.

As shown in FIGS. 14A to 14C, compared with the initial backplane 1', in the backplane 1 obtained after grinding, the two adjacent side surfaces 1c of the backplane 1 are smoothly connected through the transition side surface 1c1, and the first main surface 1a and the side surface are connected through the first transition sub-surface 1d. As shown in FIG. 14B, in the front views of the initial backplane 1' and the backplane 1, the four right angles of the initial backplane become four rounded corners. As shown in FIG. 14C, in the grinding process, in addition to grinding the boundary edge(s) B3 and the boundary edge(s) B4, the four side surfaces of the initial backplane 1' are also ground, so that an area of the obtained backplane 1 is reduced compared with that of the initial backplane 1'.

In some embodiments, after S3, a step of performing surface cleaning on the formed backboard is further included, so as to remove debris and oil contamination existing on the surfaces of the backplane after grinding. For example, the cleaning method may be a wet cleaning, an ion source cleaning, or an ozone cleaning. For example, in a case of the wet cleaning, the surfaces of the backplane may be cleaned by using a weak base KOH solution with a content of 5%, so that a surface activity of the backplane may be improved while the oil contamination is removed, so as to improve adhesion between a metal layer and the backplane in a subsequent process.

The manufacturing process of the backplane 1 includes grinding, and a sequence of the grinding steps in S3 is as follows.

Figures 17, 18:
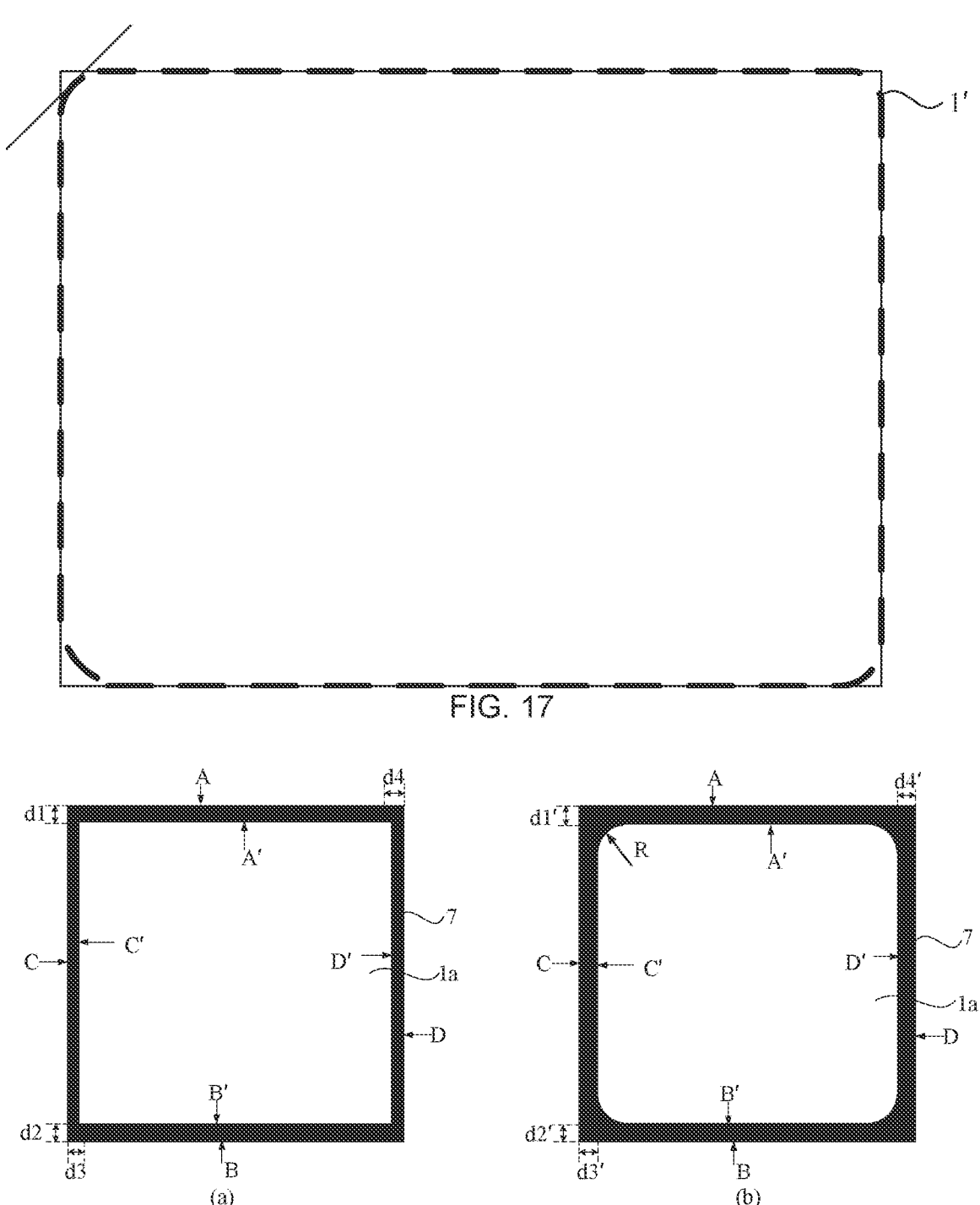
FIG. 17 is a schematic diagram of a grinding path in a grinding step of S3 in FIG. 13.
FIG. 18 is a comparison diagram of front structures of a second protective layer and an initial backplane before and after grinding, in accordance with some embodiments of the present disclosure.

As shown in FIG. 17, the dotted line represents a preset grinding path, and the upper left inclined line is a cutter entry or exit position. At the cutter entry or exit position, the grinding rod grinds the initial backplane 1' therearound integrally along the grinding path, i.e., grinds the boundary edges between the side surfaces and the adjacent surfaces of the initial backplane synchronously.

It will be noted that compared with the initial backplane 1', the backplane 1 obtained after grinding is integrally reduced all around. That is, the four side surfaces 1c' of the initial backplane 1' are ground, so that the right angle formed by two adjacent side surfaces 1c is ground into the transition side surface 1c1, and the first main surface 1a' and the second main surface 1b' of the initial backplane 1' are retained. The right angle formed by the first main surface 1*a* and the side surface 1*c* is ground into the first transition sub-surface 1*d*, and the right angle formed by the second main surface 1*b* and the side surface 1*c* is ground into the second transition sub-surface.

The grinding process is completed in two stages, a first stage is rough grinding, and a second stage is fine grinding.

In S3-1, along the preset grinding path, the grinding rod grinds the initial backplane 1' therearound for five turns to finish the rough grinding.

For example, taking a target grinding amount of 55 μm as an example, for example, before grinding, a distance between a first electrode 3 and an outer edge (i.e., a plane where the selected side surface of the initial backplane is located) of the initial backplane 1' is 125.57 μm, and after the grinding in S3 is completed, a distance between the first electrode 3 and an outer edge (i.e., a plane where the selected side surface of the backplane is located) of the backplane 1 is 70 μm, so that the outer edge of the initial backplane 1' needs to be integrally ground off by 55.57 μm. As shown in FIG. 14C, a total grinding amount D1 is 55.57 μm. For example, a grinding amount of each turn is 10 μm, a grinding amount of the five turns is 50 μm, and the remaining grinding amount is 5.57 μm. The grinding amount is a distance between the boundaries at the same position before and after a turn of grinding. The above process the rough grinding in the first stage.

In S3-2, along the preset grinding path, the grinding rod grinds the initial backing plate 1' therearound for a sixth turn.

After the fifth turn of grinding, in a process of the fine grinding in the sixth turn along the preset grinding path, a grinding amount is less than 10 μm. For example, the grinding amount is 3 μm.

In S3-3, along the preset grinding path, the grinding rod grinds the initial backing plate 1' therearound for a seventh turn.

After the sixth turn of grinding, the seventh turn of grinding repeats the sixth turn of grinding to finish the fine grinding.

For example, a grinding amount of the seventh turn of grinding is 2.57 μm, so that after the grinding is completed, the distance between the first electrode and the outer edge (i.e., the plane where the selected side surface of the backplane is located) of the backplane is 70 μm.

It will be noted that in the grinding process, the transition side surface 1*c*1 is formed at the boundary edge B3 of two adjacent side surfaces 1*c'*, the first transition sub-surface 1*d* is formed at the boundary edge B4 of the first main surface 1*a* and the side surface 1*c*, and the second transition sub-surface 1*e* is formed at the boundary edge B4 of the second main surface 1*b* and the side surface 1*c*, so as to obtain the backplane 1.

For example, an orthographic projection of the transition side surface 1*c*1 on a plane where the first main surface 1*a* is located is a circular arc, and a radius of the circular arc is in a range of 65 μm to 75 μm. For example, the radius of the circular arc is 65 μm, 70 μm, or 75 μm.

Figure 16E:
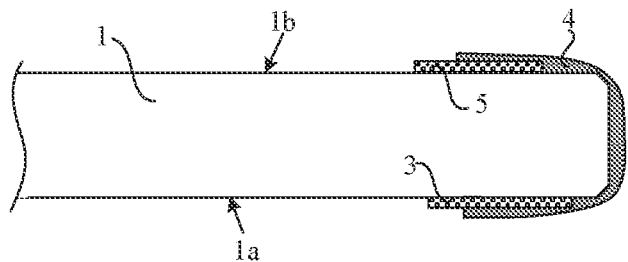

In S4, as shown in FIG. 16E, the plurality of connection leads 4 are formed on the second main surface 1*b* and the at least one side surface 1*c* of the backplane 1. Each of the plurality of connection leads 4 is electrically connected to one of the plurality of first electrodes 3 from the second main surface 1*b* of the backplane 1 via the selected side surface 1*cc*.

In some embodiments, the plurality of connection leads 4 may be further disposed on the first main surface 1*a* of the backplane 1 in addition to being formed on the second main surface 1*b* and the selected side surface 1*cc* of the backplane 1.

For example, metal layer deposition may be performed by an electroplating process or a sputtering process, so as to form a metal layer on the second main surface 1*b* and the at least one side surface 1*c* of the backplane.

In some examples, the metal layer is patterned by a laser etching process to obtain the plurality of connection leads 4.

Figure 16F:
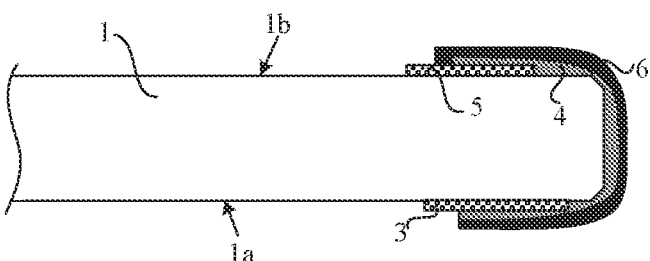

In S5, as shown in FIG. 16F, a protective adhesive layer 6 is formed on a side of the plurality of connection leads 4 facing away from the backplane. The protective adhesive layer 6 covers the plurality of connection leads 4.

In some embodiments, in a case where the display panel 10 further includes a plurality of second electrodes 5 disposed on the second main surface 1*b* of the backplane 1, the plurality of second electrodes 5 are adjacent to at least one of the plurality of side surfaces 1*c*. In a direction perpendicular to the second main surface 1*b*, positions of the plurality of second electrodes 5 are in one-to-one correspondence with positions of the plurality of first electrodes 3.

After the plurality of first electrodes 3 and the plurality of second electrodes 5 are obtained, the metal layer deposition is performed, and the metal layer is patterned to obtain the plurality of connection leads 4. Each of the plurality of connection leads 4 is electrically connected to one of the plurality of first electrodes 3 from the second main surface 1*b* via the selected side surface 1*cc*. Alternatively, each connection lead 4 is further electrically connected to a second electrode 5. A method of patterning the metal layer may be the above laser etching method, which will not be repeated here.

In some embodiments, after the initial backplane 1' is provided in S1, S2' is further included in which circuit film layers are manufactured on the initial backplane. A structure obtained after the circuit film layers are manufactured on the initial backplane may be a circuit board. The circuit film layers includes a buffer layer 11, a first metal layer 12, an insulating layer 13, a second metal layer 14, a planarization layer 15 and a passivation layer 16. Moreover, the step of forming the plurality of first electrodes 3 in S2 is included in S2'.

As shown in FIG. 15, S2' includes S2'-1 to S2'-5. The steps will be described below with reference to the sectional view of the circuit film layers on the backplane 1 shown in FIG. 9.

In S2'-1, the buffer layer 11 is formed on the first main surface 1*a*' of the initial backplane 1'.

For example, the buffer layer 11 is made of silicon nitride, or is made of polyimide. By arranging the buffer layer 11, an impact of subsequent process steps on the surface of the initial backplane 1' may be effectively reduced, and the buffer layer may also play a role in heat insulation and protection.

In S2'-2, the first metal layer 12 is formed on a side of the buffer layer 11 away from the initial backplane 1'. The first metal layer 12 includes a plurality of first signal lines.

For example, a material of the first metal layer 12 has a strong electrical conductivity, and is, for example, copper.

The first metal layer 12 includes the plurality of first signal lines and other structures. For example, a process of forming the first metal layer 12 in S2'-2 is as follows. The first metal layer 12 is formed on the side of the buffer layer 11 away from the initial backplane 1'. For example, an electroplating process or a sputtering process may be used, and the first metal layer 12 may be a copper layer. Then, the first metal layer 12 is patterned by a photolithography process or a laser etching process to form a plurality of patterns in the first metal layer 12, and the plurality of patterns include the plurality of first signal lines 121 and other structures.

In S2'-3, the insulating layer 13 is formed on a side of the first metal layer 12 away from the initial backplane 1'. The insulating layer 13 includes a plurality of first vias a1, and the first via a1 exposes the first metal layer 12.

In some embodiments, the buffer layer 11 and the insulating layer 13 are made of the same material. For example, the buffer layer 11 and the insulating layer 13 are made of silicon nitride.

As a possible design, a process of forming the insulating layer 13 in S2'-3 is as follows. An insulating film layer is formed on the side of the first metal layer 12 away from the initial backplane 1'. For example, the insulating film layer may be formed on the side of the first metal layer 12 away from the initial backplane 1' by a deposition process. Then, the insulating film layer is patterned by a photolithography process or a laser etching process to manufacture the plurality of first vias a1 in the insulating film layer penetrating therethrough to the first metal layer 12, thereby forming the insulating layer 13.

In S2'-4, the second metal layer 14 is formed on a side of the insulating layer 13 away from the initial backplane 1'. The second metal layer 14 includes the plurality of first electrodes 3 and a plurality of second signal lines 141. The plurality of first electrodes 3 and the plurality of second signal lines 141 are electrically connected to the first metal layer 12 through the respective first vias a1. The second metal layer 14 further includes a plurality of connection pads 142.

As a possible design, a process of forming the second metal layer 14 in S2'-4 is as follows. The second metal layer 14 is formed on the side of the insulating layer 13 away from the initial backplane 1'. For example, the second metal layer 14 may be formed on the side of the first metal layer 12 away from the initial backplane 1' by an electroplating process or a sputtering process. Then, the second metal layer 14 is patterned by a photolithography process or a laser etching process to manufacture the plurality of first electrodes 3 in the second metal layer 14, thereby forming the second metal layer 14.

As a possible design, the first metal layer 12 and the second metal layer 14 are made of the same material with a strong electrical conductivity. The first metal layer 12 and the second metal layer 14 are made of, for example, copper.

In S2'-5, the planarization layer 15 and the passivation layer 16 are sequentially formed on a side of the second metal layer 14 away from the initial backplane 1'. The planarization layer 15 includes a plurality of second vias a2, and the passivation layer 16 includes a plurality of third vias a3.

For example, the planarization layer 15 is made of an organic material, e.g., resin. A material of the passivation layer 16 includes at least one of silicon nitride and silicon oxide.

As a possible design, a process of forming the planarization layer 15 and the passivation layer 16 in S2'-5 is as follows. For example, the planarization layer 15 and the passivation layer 16 may be sequentially formed by a deposition process. Then, the planarization layer 15 and the passivation layer 16 are patterned by a photolithography process or a laser etching process to manufacture the plurality of second vias a2 in the planarization layer 15 and the third vias a3 in the passivation layer 16. Each second via a2 is connected to a third via a3, and penetrates the planarization layer 15 to the first metal layer 12, thereby forming the planarization layer 15 and the passivation layer 16 that are patterned.

In some embodiments, the manufacturing method of the display panel 10 further includes: providing a plurality of light-emitting devices 2 and a plurality of pixel driving chips 02. As an example, the plurality of light-emitting devices 2 are mini light-emitting diodes, which are commonly referred to as mini light-emitting diode (Mini LED) chips.

For example, the light-emitting devices 2 and the pixel driving chips 02 have been prepared in other processes. In this step, the light-emitting devices 2 and the pixel driving chips 02 are transferred and fixed to the connection pads in the circuit board.

In some embodiments, after the plurality of connection leads are manufactured, the plurality of light-emitting devices 2 are disposed. That is, after the plurality of connection leads 4 are formed on the second main surface 1b and the at least one side surface 1c of the backplane 1, the plurality of light-emitting devices 2 are formed on the first main surface 1a of the backplane 1. For example, the plurality of Mini LED chips are transferred to the first main surface 1a of the backplane 1. As shown in FIG. 9, for example, a pin of the Mini LED chip is connected to a connection pad 142 in the second metal layer 14 through a via, and a pin of the pixel driving chip 02 is connected to a connection pad 142 in the second metal layer 14 through a via.

In some embodiments, the manufacturing method of the display panel 10 further includes: after providing the plurality of light-emitting devices 2 and the plurality of pixel driving chips 02, forming a second protective layer 7 on a side of the backplane 1 where the first main surface 1a is located.

For example, the second protective layer 7 is disposed on a side of the plurality of light-emitting devices 2 and the plurality of pixel driving chips 02 away from the first main surface 1a, e.g., is further pressed by an attaching process. Portions of the second protective layer are respectively embedded in gaps between the plurality of light-emitting devices 2 and/or the plurality of pixel driving chips 02. The second protective layer 7 is entirely covered on surfaces of the plurality of light-emitting devices 2.

In some examples, as shown in FIG. 18, a surface area of the second protective layer 7 is greater than a surface area of the first main surface 1a of the backplane 1, and the first main surface 1a of the backplane 1 is within an orthographic projection of the second protective layer 7 on the plane where the first main surface 1a of the backplane 1 is located. There is a distance between a contour edge of the orthographic projection of the second protective layer 7 and a contour edge of the first main surface, and the distance between the two corresponding contour edges is in a range of 30 μm to 90 μm, inclusive.

As shown in (a) of FIG. 18, in the backplane 1 obtained by the conventional right-angle grinding, a vertical distance d1 between a border A of the orthographic projection of the second protective layer 7 on the plane where the first main surface 1a of the backplane 1 is located and a corresponding border A' of the first main surface 1a of the backplane 1 is in a range of a difference of 70 μm and 20 μm to a sum of 70 μm and 20 μm (i.e., d1=70±20 μm); a vertical distance d2 between a border B of the orthographic projection of the second protective layer 7 on the plane where the first main surface 1a of the backplane 1 is located and a corresponding border B' of the first main surface 1a of the backplane 1 is in a range of a difference of 70 μm and 20 μm to a sum of 70 μm and 20 μm (i.e., d2=70±20 μm); a vertical distance d3 between a border C of the orthographic projection of the second protective layer 7 on the plane where the first main surface 1a of the backplane 1 is located and a corresponding border C' of the first main surface 1a of the backplane 1 is in a range of a difference of 50 μm and 20 μm to a sum of 50 μm and 20 μm (i.e., d3=50±20 μm); and a vertical distance d4 between a border D of the orthographic projection of the second protective layer 7 on the plane where the first main surface 1a of the backplane 1 is located and a corresponding border D' of the first main surface 1a of the backplane 1 is in a range of a difference of 65 μm and 20 μm to a sum of 65 μm and 20 μm (i.e., d4=65±20 μm). As shown in (b) of FIG. 18, in the backplane 1 obtained by changing the conventional right-angle grinding into the radius grinding, a vertical distance d1' between a border A of the orthographic projection of the second protective layer 7 on the plane where the first main surface 1a of the backplane 1 is located and a corresponding border A' of the first main surface 1a of the backplane 1 is in a range of a difference of 75 μm and 20 μm to a sum of 75 μm and 20 μm (i.e., d1'=75±20 μm); a vertical distance d2' between a border B of the orthographic projection of the second protective layer 7 on the plane where the first main surface 1a of the backplane 1 is located and a corresponding border B' of the first main surface 1a of the backplane 1 is in a range of a difference of 75 μm and 20 μm to a sum of 75 μm and 20 μm (i.e., d2'=75±20 μm); a vertical distance d3' between a border C of the orthographic projection of the second protective layer 7 on the plane where the first main surface 1a of the backplane 1 is located and a corresponding border C' of the first main surface 1a of the backplane 1 is in a range of a difference of 65 μm and 20 μm to a sum of 65 μm and 20 μm (i.e., d3'=65±20 μm); and a vertical distance d4' between a border D of the orthographic projection of the second protective layer 7 on the plane where the first main surface 1a of the backplane 1 is located and a corresponding border D' of the first main surface 1a of the backplane 1 is in a range of a difference of 70 μm and 20 μm to a sum of 70 μm and 20 μm (i.e., d4'=70±20 μm). It can be known from the above dimensions that compared with the right-angle grinding, the size of the backplane 1 obtained by the radius grinding is reduced, and the distance between the contour edge thereof and the contour edge of the orthographic projection of the second protective layer is increased.

In some examples, as shown in FIG. 18, in the right-angle grinding, the vertical distance d1 of the border A of the orthographic projection of the second protective layer 7 on the plane where the first main surface 1a of the backplane 1 is located and the corresponding border A' of the first main surface 1a of the backplane 1 is 70 μm (i.e., d1=70 μm); the vertical distance d2 of the border B of the orthographic projection of the second protective layer 7 on the plane where the first main surface 1a of the backplane 1 is located and the corresponding border B' of the first main surface 1a of the backplane 1 is 70 μm (i.e., d2=70 μm); the vertical distance d3 of the border C of the orthographic projection of the second protective layer 7 on the plane where the first main surface 1a of the backplane 1 is located and the corresponding border C' of the first main surface 1a of the backplane 1 is 50 μm (i.e., d3=50 μm); and the vertical distance d4 of the border D of the orthographic projection of the second protective layer 7 on the plane where the first main surface 1a of the backplane 1 is located and the corresponding border D' of the first main surface 1a of the backplane 1 is 65 μm (i.e., d4=65 μm). After the conventional right-angle grinding is changed into the radius grinding, the vertical distance d1' between the border A of the orthographic projection of the second protective layer 7 on the plane where the first main surface 1a of the backplane 1 is located and the corresponding border A' of the first main surface 1a of the backplane 1 is 75 μm (i.e., d1'=75 μm); the vertical distance d2' between the border B of the orthographic projection of the second protective layer 7 on the plane where the first main surface 1a of the backplane 1 is located and the corresponding border B' of the first main surface 1a of the backplane 1 is 75 μm (i.e., d2'=75 μm); the vertical distance d3' between the border C of the orthographic projection of the second protective layer 7 on the plane where the first main surface 1a of the backplane 1 is located and the corresponding border C' of the first main surface 1a of the backplane 1 is 65 μm (i.e., d3'=65 μm); and the vertical distance d4' between the border D of the orthographic projection of the second protective layer 7 on the plane where the first main surface 1a of the backplane 1 is located and the corresponding border D' of the first main surface 1a of the backplane 1 is 70 μm (i.e., d4'=70 μm).

After the display panel is obtained by the manufacturing method of the display panel in some embodiments of the present disclosure, the driving chip or the flexible printed circuit is bonded to the second main surface of the backplane, so that the display device with an ultra-narrow bezel may be obtained. Since the backplane is subjected to the grinding process, each corner of the backplane is smoothly transitioned, so that the problem of edge and corner collapsing during transportation is able to be avoided, and the cost is saved.

For example, the driving chip or the flexible printed circuit may be bonded to the plurality of second electrodes, or may be bonded to the portion of each of the plurality of connection leads located on the second main surface of the backplane, so that the driving chip or the flexible printed circuit is disposed on the back surface of the display panel.

The foregoing descriptions are merely some specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A display panel, comprising:
   a backplane including a first main surface and a second main surface opposite to each other, and a plurality of side surfaces connecting the first main surface and the second main surface; wherein at least one side surface in the plurality of side surfaces is a selected side surface; two adjacent side surfaces are provided with a transition side surface therebetween, and are connected through the transition side surface;
   a plurality of first electrodes disposed on the first main surface; wherein the plurality of first electrodes are adjacent to the selected side surface;
   a buffer layer disposed on the first main surface of the backplane;
   a first metal layer disposed on a side of the buffer layer away from the backplane; wherein the first metal layer includes a plurality of first signal lines;
   an insulating layer disposed on a side of the first metal layer away from the backplane;
   a second metal layer disposed on a side of the insulating layer away from the backplane; wherein the second metal layer includes the plurality of first electrodes and a plurality of second signal lines;

a planarization layer disposed on a side of the second metal layer away from the backplane; and a passivation layer disposed on a side of the planarization layer away from the backplane; wherein a border of the passivation layer is closer to a side surface of the backplane than a border of the planarization layer located on a same side as the border of the passivation layer.

2. The display panel according to claim 1, wherein the transition side surface is an arc surface.

3. The display panel according to claim 2, wherein an orthographic projection of the transition side surface on a plane where the first main surface is located is a circular arc, and a radius of the circular arc is in a range of 65 μm to 75 μm, inclusive.

4. The display panel according to claim 1, wherein the transition side surface is a plane; or the transition side surface includes at least two adjacent planes.

5. The display panel according to claim 4, wherein the transition side surface is the plane; in a section of the backplane taken along a plane parallel to the first main surface, an angle formed between the transition side surface and a side surface adjacent to the transition side surface is greater than 90°; or the transition side surface includes the at least two adjacent planes, and a plane in the at least two adjacent planes connected to the side surface is a first plane; in a section of the backplane taken along the plane parallel to the first main surface, an angle formed between the first plane and the side surface connected to the first plane is greater than 90°, and an angle formed between two adjacent planes in the transition side surface is greater than 90°.

6. The display panel according to claim 1, wherein the first main surface and a side surface in the plurality of side surfaces are provided with a first transition sub- surface therebetween, and are connected through the first transition sub-surface; and/or the second main surface and the side surface are provided with a second transition sub-surface therebetween, and are connected through the second transition sub-surface.

7. The display panel according to claim 6, wherein in a section of the backplane taken along a plane perpendicular to the first main surface and the side surface, an angle formed between a tangent line at any point on the first transition sub-surface and the first main surface is greater than 90°, and an angle formed between the tangent line at the any point on the first transition sub-surface and the side surface is greater than 90°; and/or in a section of the backplane taken along a plane perpendicular to the second main surface and the side surface, an angle formed between a tangent line at any point on the second transition sub-surface and the second main surface is greater than 90°, and an angle formed between the tangent line at the any point on the second transition sub-surface and the side surface is greater than 90°.

8. The display panel according to claim 6, wherein the first transition sub-surface and the second transition sub- surface each are a plane or an arc surface.

9. The display panel according to claim 1, wherein the plurality of first electrodes are arranged side by side, and a vertical distance between an end of each of the plurality of first electrodes proximate to the selected side surface and a plane where the selected side surface is located is in a range of 60 μm to 80 μm, inclusive.

10. The display panel according to claim 1, further comprising:

a plurality of light-emitting devices disposed on the first main surface of the backplane; wherein the plurality of light-emitting devices are electrically connected to the plurality of first electrodes; and a plurality of connection leads disposed on the second main surface and the selected side surface of the backplane; wherein each connection lead is electrically connected to one of the plurality of first electrodes from the second main surface via the selected side surface.

11. The display panel according to claim 10, wherein the display panel further comprises a plurality of second electrodes disposed on the second main surface of the backplane; wherein the plurality of second electrodes are configured to be electrically connected to a driving chip or a flexible printed circuit; the connection lead is further electrically connected to one of the plurality of second electrodes.

12. The display panel according to claim 1, wherein the planarization layer covers a portion of the plurality of first electrodes, and the border of the passivation layer is closer to the selected side surface of the backplane than a border of the plurality of first electrodes located on the same side as the border of the passivation layer.

13. The display panel according to claim 1, wherein the plurality of first signal lines extend in a first direction, and each first signal line is electrically connected to a first electrode through a via penetrating the insulating layer; a dimension of the first electrode in a second direction is positively correlated with an average width of the first signal line connected to the first electrode in the second direction; wherein the second direction is perpendicular to the first direction.

14. The display panel according to claim 1, wherein the display panel comprises a plurality of pixels arranged in an array, and each pixel includes at least two light-emitting devices and a pixel driving chip.

15. The display panel according to claim 14, wherein the second metal layer further includes a plurality of connection pads connecting the light-emitting devices to the pixel driving chip.

16. A display device, comprising:

the display panel according to claim 1; and a driving chip disposed on the second main surface of the backplane in the display panel; wherein the driving chip is electrically connected to the plurality of first electrodes in the display panel through a plurality of connection leads in the display panel.

17. A manufacturing method of a display panel, comprising:

providing an initial backplane; wherein the initial backplane includes a first main surface and a second main surface opposite to each other, and a plurality of side surfaces connecting the first main surface and the second main surface; the plurality of side surfaces are perpendicular to the first main surface and the second main surface;

grinding a boundary edge of two adjacent side surfaces to form a transition side surface at the boundary edge; wherein the two adjacent side surfaces are connected through the transition side surface; the transition side surface is a plane; or the transition side surface includes at least two adjacent planes; or the transition side surface is an arc surface; and the method further comprising:

forming a buffer layer on the first main surface of the initial backplane;

forming a first metal layer on a side of the buffer layer away from the initial backplane, wherein the first metal layer includes a plurality of first signal lines;

forming an insulating layer on a side of the first metal layer away from the initial backplane;

forming a second metal layer on a side of the insulating layer away from the initial backplane, wherein the second metal layer includes the plurality of first electrodes and a plurality of second signal lines;

forming a planarization layer on a side of the second metal layer away from the initial backplane; and forming a passivation layer on a side of the planarization layer away from the initial backplane; wherein a border of the passivation layer is closer to a side surface of the backplane than a border of the planarization layer located on a same side as the border of the passivation layer.

18. The manufacturing method of the display panel according to claim 17, further comprising:

in a process of grinding the boundary edge of the two adjacent side surfaces, grinding a boundary edge of the first main surface and a side surface in the plurality of side surfaces to form a first transition sub-surface; and/or grinding a boundary edge of the second main surface and the side surface to form a second transition sub-surface; the first transition sub-surface and the second transition sub-surface each are a plane or an arc surface.

\* \* \* \* \*